(12) United States Patent
Tada et al.

(10) Patent No.: US 8,084,294 B2
(45) Date of Patent: Dec. 27, 2011

(54) METHOD OF FABRICATING ORGANIC SILICON FILM, SEMICONDUCTOR DEVICE INCLUDING THE SAME, AND METHOD OF FABRICATING THE SEMICONDUCTOR DEVICE

(75) Inventors: Munehiro Tada, Tokyo (JP); Tsuneo Takeuchi, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 554 days.

(21) Appl. No.: 11/884,713

(22) PCT Filed: Feb. 14, 2006

(86) PCT No.: PCT/JP2006/302525
§ 371 (c)(1),
(2), (4) Date: Aug. 20, 2007

(87) PCT Pub. No.: WO2006/088015
PCT Pub. Date: Aug. 24, 2006

(65) Prior Publication Data
US 2008/0251926 A1    Oct. 16, 2008

(30) Foreign Application Priority Data
Feb. 18, 2005    (JP) ................................. 2005-043232

(51) Int. Cl.
*H01L 51/40*    (2006.01)
(52) U.S. Cl. .................. 438/99; 438/623; 257/E23.167; 257/E21.576

(58) Field of Classification Search ........... 257/E23.167, 257/E21.576; 438/623; 427/489
See application file for complete search history.

(56) References Cited

U.S. PATENT DOCUMENTS

| 6,436,824 B1 * | 8/2002 | Chooi et al. ................. 438/687 |
| 6,784,118 B2 | 8/2004 | Hayashi et al. |
| 7,012,007 B1 * | 3/2006 | Goo et al. ..................... 438/296 |
| 2006/0226516 A1 * | 10/2006 | Goodner et al. ............. 257/632 |

FOREIGN PATENT DOCUMENTS

| JP | 10-242143 | 9/1998 |
| JP | 2000-031118 | 1/2000 |
| JP | 2001-308082 | 11/2001 |
| JP | 2002-513203 | 5/2002 |
| JP | 2002-526916 | 8/2002 |
| JP | 2004-047873 | 2/2004 |
| JP | 2004-095865 | 3/2004 |
| JP | 2004-221275 | 8/2004 |
| JP | 2004-289105 | 10/2004 |
| JP | 2005-071741 | 3/2005 |

OTHER PUBLICATIONS

Japanese Official Action—2007-503657—Jun. 21, 2011.
Japanese Official Action—2007-503657—Sep. 13, 2011.

* cited by examiner

*Primary Examiner* — David S Blum
*Assistant Examiner* — Colleen E Snow
(74) *Attorney, Agent, or Firm* — Young & Thompson

(57) ABSTRACT

An organic silicon film is formed by carrying out chemical vapor deposition with organic silicon compound being used as a raw material gas. The organic silicon compound contains at least silicon, hydrogen and carbon as a constituent thereof, and contains two or more groups having unsaturated bond, per a molecule thereof. The organic silicon compound is used in mixture with a silicon hydride gas.

4 Claims, 6 Drawing Sheets

[FIG.1]
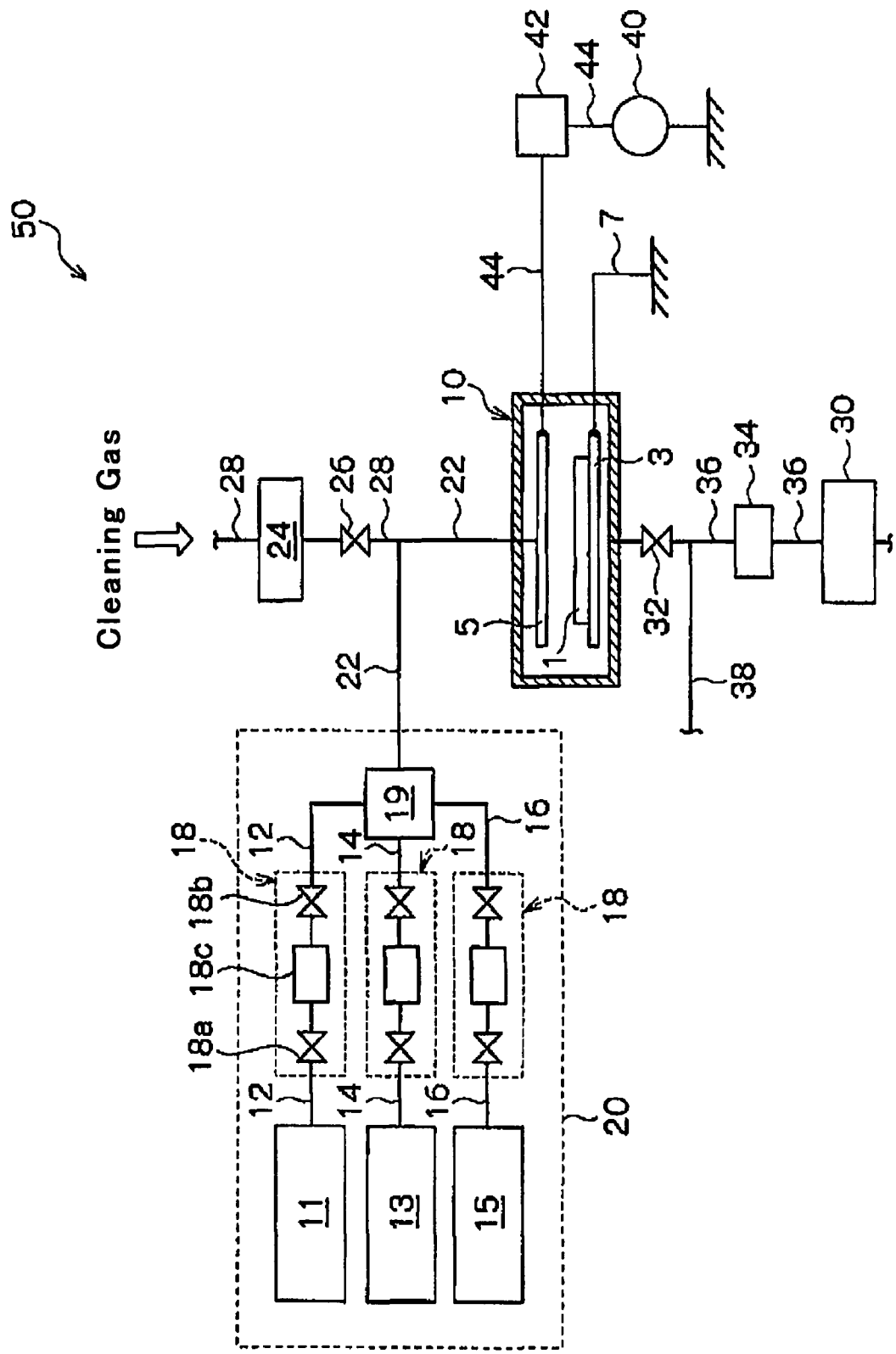

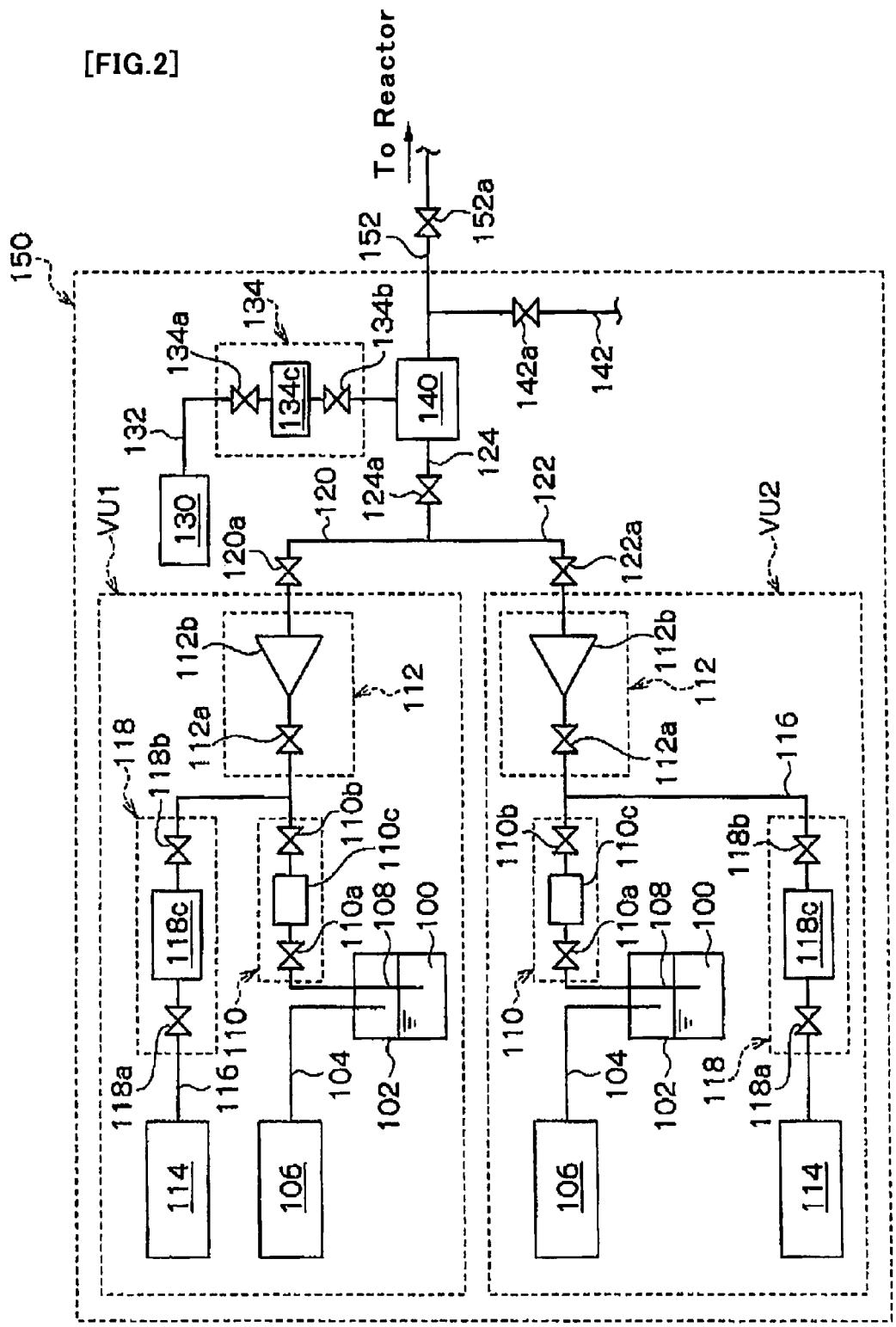
[FIG.2]

[FIG.3]
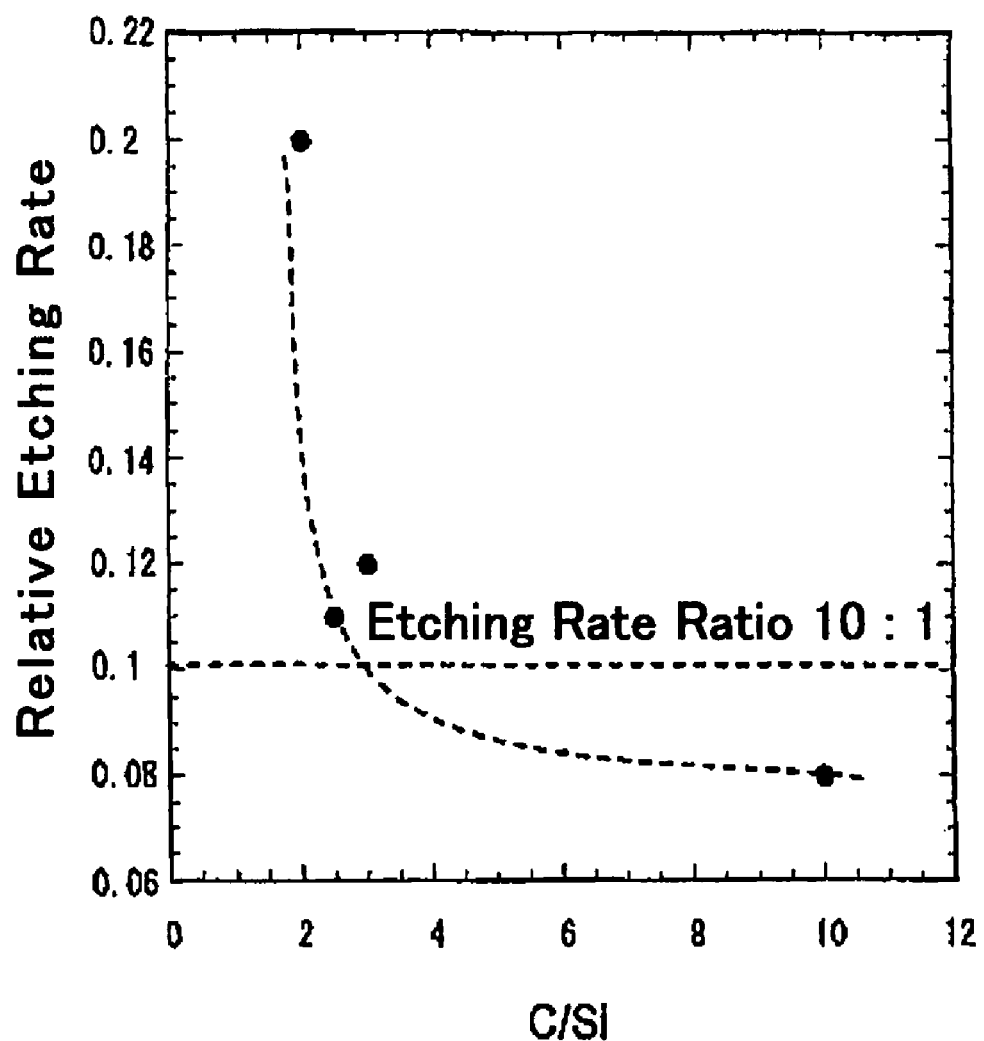

[FIG.4]
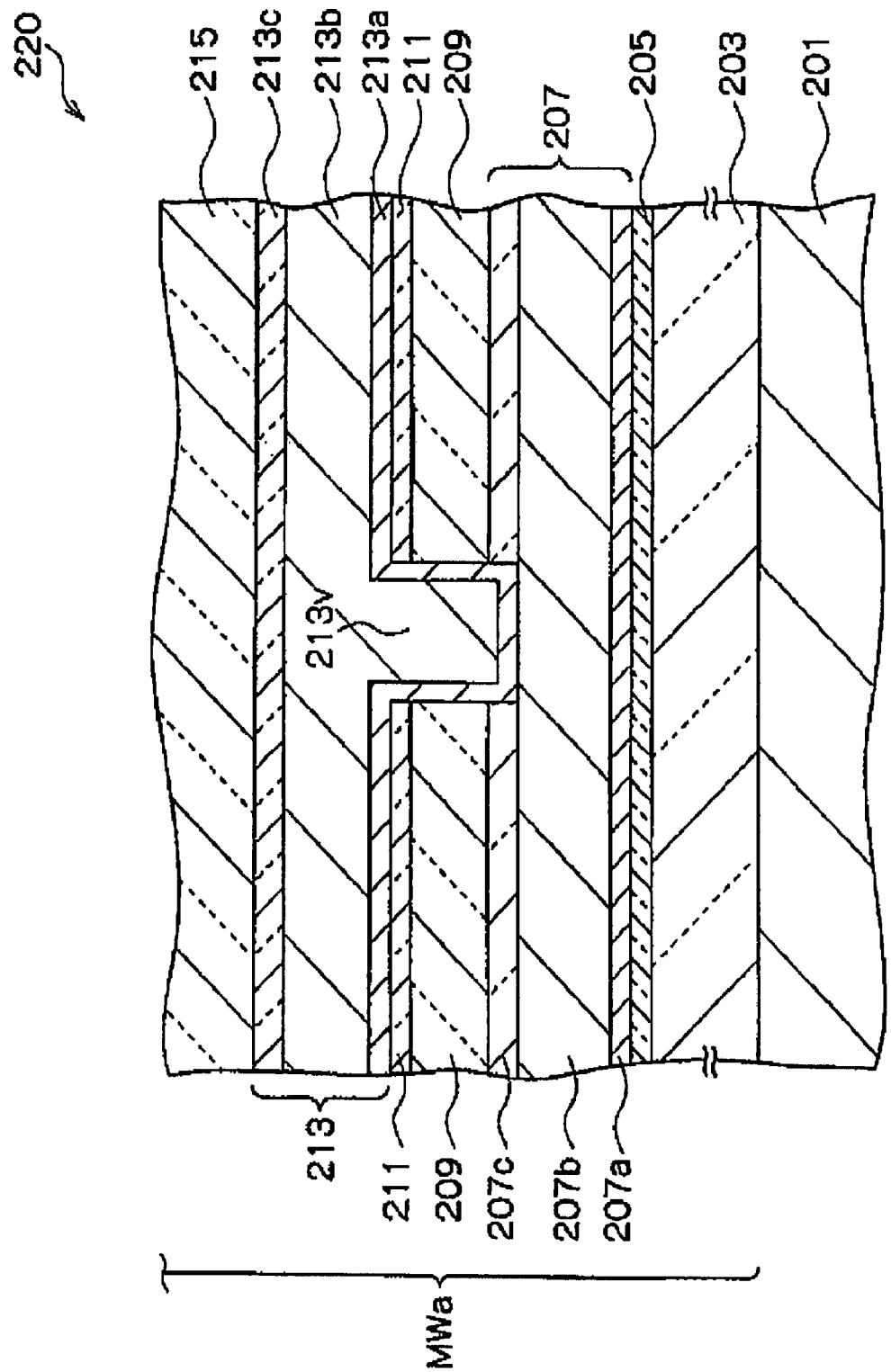

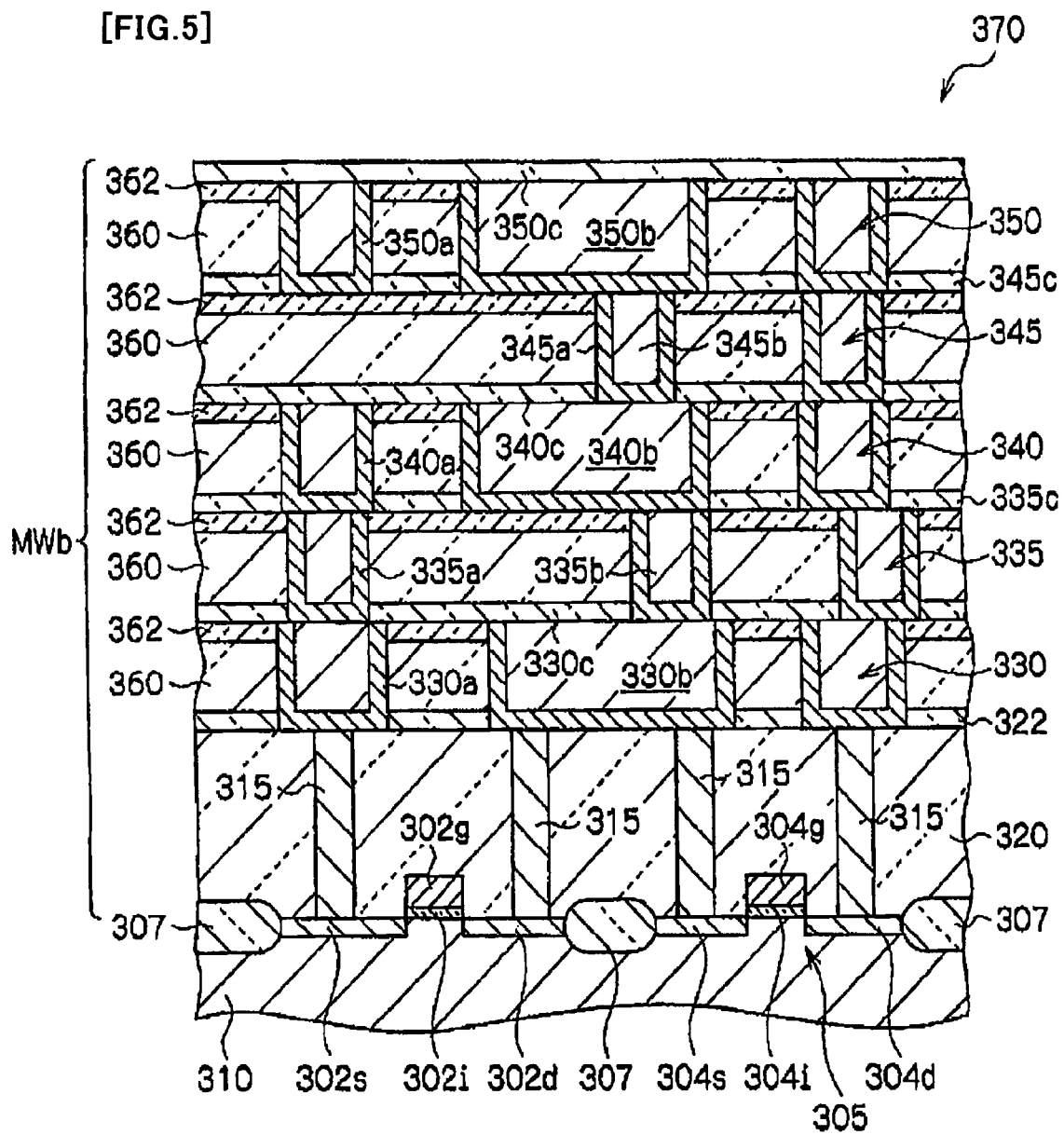
[FIG.5]

[FIG.6]
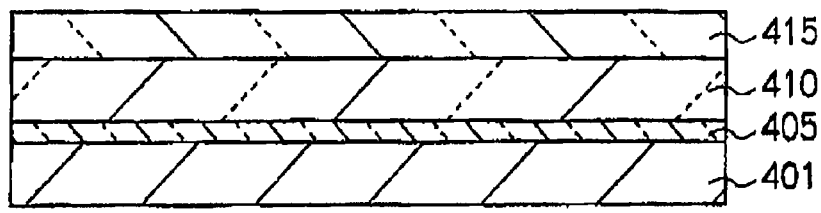
(A)
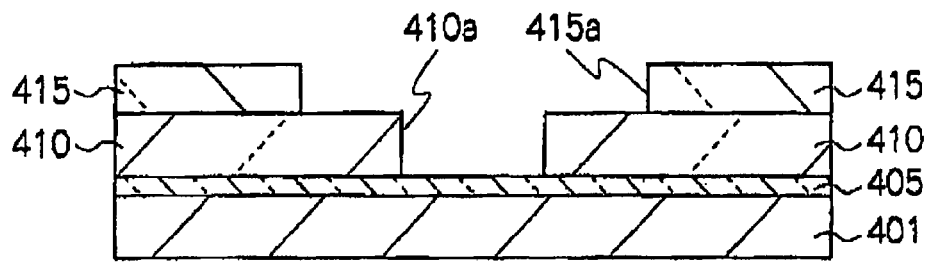
(B)
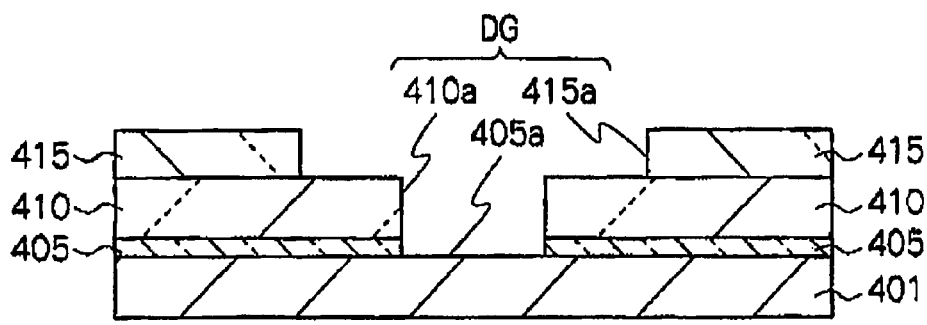
(C)
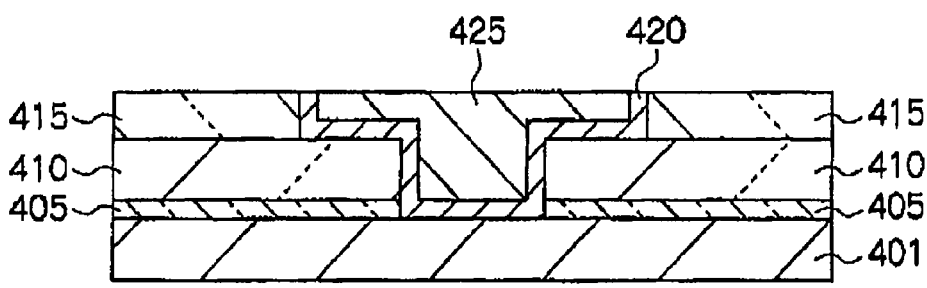
(D)
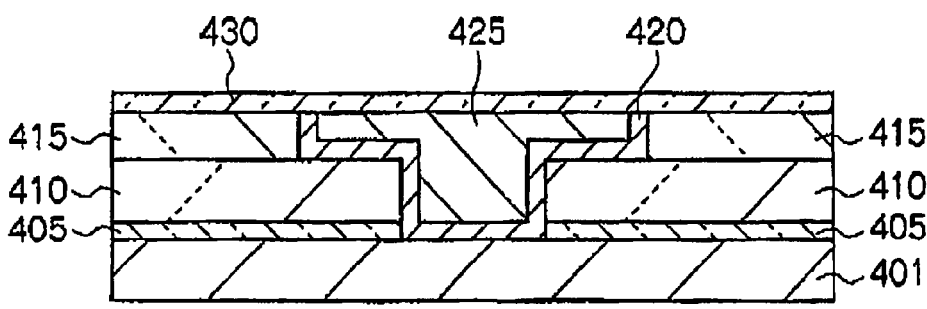
(E)

METHOD OF FABRICATING ORGANIC SILICON FILM, SEMICONDUCTOR DEVICE INCLUDING THE SAME, AND METHOD OF FABRICATING THE SEMICONDUCTOR DEVICE

BACKGROUND OF THE INVENTION

1. Field of the Invention

The invention relates to a method of fabricating an organic silicon film, a semiconductor device including the organic silicon film, and a method of fabricating the semiconductor device.

2. Description of the Related Art

A large-scale integrated circuit (LSI) including a silicon substrate or a silicon layer on which a plurality of circuit elements are integrated has frequently included wires composed of aluminum (Al) or Al alloy.

Recently, a wire dimension becomes smaller as integration of circuit elements in an integrated circuit becomes higher. Hence, reduction in wire resistance and high reliability to wires are presently required, and thus, copper (Cu) is selected in place of aluminum as a material of which a wire is composed.

However, copper readily scatters into a silicon oxide film frequently used as an element-separation film or an interlayer insulating film in a silicon semiconductor integrated circuit, and caused current leakage. Thus, a copper wire is covered at a sidewall and a bottom thereof with an electrically conductive barrier metal film for preventing copper from being oxidized and further from scattering, and at an upper surface with an electrically insulating barrier film.

There is recently caused a problem of an increase in a capacity between wires as a wire dimension becomes small. In order to reduce such a capacity, an interlayer insulating film is often comprised of a film having a low dielectric constant, such as a HSQ (Hydrogen Silsesquioxane) film, a CDO (Carbon-Doped Oxide) film, or an organic film.

Such a film having a low dielectric constant is formed by spin-coating or vapor deposition, for instance. If the above-mentioned electrically insulating barrier film formed when a copper wire is used had a high dielectric constant, the electrically insulating barrier film would increase a capacity between wires. Accordingly, it is necessary for the electrically insulating barrier film to have a low dielectric constant.

An electrically insulating barrier film is required to have characteristics such as (i) having sufficient barrier performance for preventing copper from scattering, (ii) low current leakage, (iii) being able to be formed without oxidizing copper at a surface or degrading copper, (iv) being able to act as an etching-stopper film (that is, having etching-controllability), and (v) a low dielectric constant of a material of which the electrically insulating barrier film is composed.

A silicon carbide-nitride (SiCN) film having a dielectric constant (k) of about 5.0, and a silicon carbide (SiC) film having a dielectric constant of about 4.5 are known as an electrically insulating barrier film satisfying the above-mentioned requirement. These SiCN and SiC films are formed by spin-coating or chemical vapor deposition (CVD) such as plasma-enhanced chemical vapor deposition.

A SiC film formed by spin-coating or chemical vapor deposition is referred to as "an organic SiC film".

For instance, Japanese Patent Application Publication No. 2000-3118 suggests a method of forming an organic SiC film (organic silicon carbide film) composed of polysilane, by spin-coating.

Japanese Patent Application Publication No. 2002-526916 suggests a method of forming an organic SiC film (organic silicon carbide film) by chemical vapor deposition through the use of silane compound as a raw material gas.

Japanese Patent Application Publication No. 2004-221275 suggests a method of forming an organic SiC film by chemical vapor deposition through the use of organic silane (including organic silane having a vinyl group) as a raw material gas.

The formation of an organic SiC film by spin-coating provides an advantage that a raw material can be selected among broad range of materials relative to the formation of an organic SiC film by chemical vapor deposition. However, the formation of an organic SiC film by spin-coating is accompanied with problems that it is difficult to control a film thickness in a nanometer order, and it is also difficult for the film to have a sufficient strength and high adhesion with an underlying film.

In contrast, if an organic SiC film is formed by chemical vapor deposition through the use of silane compound having no vinyl groups, such as trimethyl silane or tetramethyl silane, as a raw material gas, a lot of non-bonding hands would exist in the film, since the deposition of the film progresses as breakage and re-bonding of a raw material are repeated. Non-bonding hands existing in an organic SiC film is a bar to obtain an organic SiC film reducing current leakage.

It is possible to obtain an organic SiC film including a small number of non-bonding hands therein by forming the organic SiC film by chemical vapor deposition through the use of silane compound having a vinyl group, as a raw material gas. However, if an organic SiC film is to be formed at a practical film-formation speed through the use of silane compound having one vinyl group per a molecule, as a raw material gas, dimer is likely to be generated in the resultant organic SiC film. Such dimer is a bar to enhance a strength and a resistance to heat of the resultant organic SiC film.

For instance, if an organic SiC film is formed at a practical film-formation speed by plasma-enhanced chemical vapor deposition through the use of trimethylvinyl silane as a raw material gas, unsaturated bond (double bonds of carbon atoms) existing in a vinyl group is excited by plasma, and receives thermal energy, resulting in that the reaction expressed with the formula (CR5) occurs.

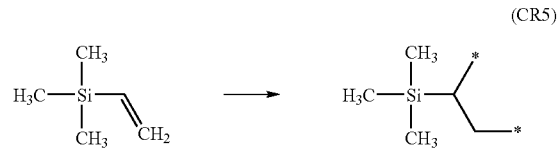

(CR5)

Actually, ring-opening reaction such as expressed with the formula (CR5) successively occurs in plasma or at a surface of a substrate (a surface of an object on which an organic SiC film is to be formed), and accordingly, reactive groups cause polymerization reaction. During such polymerization reaction, dimer expressed with the formula (Xa) is likely to be generated, and thus, a cross-linking structure is likely to be generated.

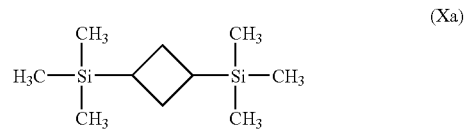

(Xa)

Thus, as mentioned above, dimer is a bar to enhance a strength and a resistance to heat of an organic SiC film.

It would be possible to form an organic SiC film having a three-dimensional network structure, expressed with the formula (Xb), by applying energy to a film such that a methyl group existing in trimethylvinyl silane molecule is broken, to thereby generate a lot of non-bonding hands in trimethylvinyl silane molecule.

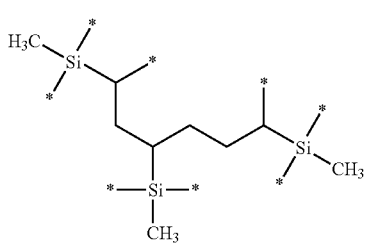

However, if energy which can break a methyl group is applied to a film during the formation of the film, a film-formation speed would be reduced to a non-practical level.

Furthermore, an atom number ratio of carbon atoms of a resultant organic SiC film becomes small, resulting in that it would be difficult to obtain an organic SiC film having desired characteristics such as a dielectric constant, a strength, and a resistance to heat.

The symbol "*" in the formulas (CR5) and (Xb) indicates a non-bonding hand.

If silane compound having two or more vinyl groups per a molecule is used as a raw material gas, since a three-dimensional network structure is formed by addition polymerization among molecules, a resultant organic SiC film would have a high strength and a high resistance to heat. However, it is difficult to sufficiently react vinyl bonds by a conventional process, and hence, vinyl bonds are likely to remain non-reacted in a resultant organic SiC film. Such vinyl bonds remaining in a resultant organic SiC film are bar to obtain an organic SiC film reducing current leakage.

SUMMARY OF THE INVENTION

In view of the above-mentioned problems, it is a first object of the present invention to provide a method of forming an organic silicon film having a low dielectric constant, and reducing current leakage.

It is a second object of the present invention to provide a semiconductor device having a small capacity between wires, and reducing a current leaking from wires.

It is a third object of the present invention to provide a method of fabricating a semiconductor device having a small capacity between wires, and reducing a current leaking from wires.

In order to accomplish the above-mentioned first object, the present invention provides a method of fabricating an organic silicon film by carrying out chemical vapor deposition with organic silicon compound being used as a raw material gas, the organic silicon compound containing at least silicon, hydrogen and carbon as a constituent thereof, and containing two or more groups having unsaturated bond, per a molecule thereof, the organic silicon compound being used in mixture with a silicon hydride gas (hereinafter, the method may be called "the first film-fabrication method in accordance with the present invention").

In the first film-fabrication method in accordance with the present invention, since the above-mentioned organic silicon compound is used as a raw material gas, it is possible to obtain an organic SiC film having a three-dimensional network structure formed by addition polymerization among molecules of a raw material gas.

Furthermore, since a silicon hydride gas is used in mixture with the above-mentioned organic silicon compound, hydrogen ions (protons) are dissociated from a silicon hydride gas during an organic SiC film is being formed, and act as electrophilic reagent. As a result, reactivity in each of two or more unsaturated bonds contained in an organic silicon compound per a molecule thereof is enhanced, and accordingly, it is difficult for non-bonding hands and non-reacted unsaturated bonds to remain in the film. Thus, since there is formed an organic silicon film having a three-dimensional network structure principally by addition polymerization without bonds other than π-bond being broken, it would be readily possible to control a composition of a resultant film.

Thus, the first film-fabrication method in accordance with the present invention provides an organic silicon film having a low dielectric constant, and reducing current leakage.

In order to accomplish the above-mentioned first object, the present invention further provides a method of fabricating an organic silicon film by carrying out chemical vapor deposition with organic silicon compound being used as a raw material gas, the organic silicon compound containing at least silicon, hydrogen and carbon as a constituent thereof, and containing one or more cyclic group having unsaturated bond, per a molecule thereof, the organic silicon compound being used in mixture with a silicon hydride gas (hereinafter, the method may be called "the second film-fabrication method in accordance with the present invention").

In the second film-fabrication method in accordance with the present invention, since the above-mentioned organic silicon compound is used as a raw material gas, the above-mentioned cyclic group is open, and a bond of conjugate π electrons is generated at opposite ends of the cyclic group. Thus, there is formed an organic silicon film having a three-dimensional network structure by addition polymerization among molecules.

Furthermore, since a silicon hydride gas is used in mixture with the above-mentioned organic silicon compound, hydrogen ions (protons) are dissociated from a silicon hydride gas during an organic SiC film is being formed, and act as electrophilic reagent. As a result, reactivity of the cyclic group enhances, and accordingly, it is possible to prevent non-bonding hands and non-reacted unsaturated bonds from remaining in the film. Thus, since there is formed an organic silicon film having a three-dimensional network structure principally by addition polymerization without bonds other than π-bond being broken, it would be readily possible to control a composition of a resultant film.

Thus, the second film-fabrication method in accordance with the present invention provides an organic silicon film having a low dielectric constant, and reducing current leakage.

In order to accomplish the above-mentioned second object, the present invention provides a semiconductor device comprising: at least one circuit element formed on a semiconductor substrate or a semiconductor layer; and a multi-layered wire structure formed on the semiconductor substrate or the semiconductor layer in such a condition as being electrically connected to the at least one circuit element, wherein at least one electrically insulating film among electrically insulating films included in the multi-layered wire structure is comprised of an organic silicon film having a three-dimensional network structure, and containing at least silicon, hydrogen and carbon as a constituent thereof, and an atomic number ratio of carbon atoms to silicon atoms in the organic silicon film is greater than 3.

Since the electrically insulating film in the semiconductor device is comprised of an organic silicon film having a three-dimensional network structure, the electrically insulating film can have a high strength and a high resistance to heat.

Furthermore, since an atomic number ratio of carbon atoms to silicon atoms is greater than 3, it is possible to have a high etching selection ratio (etching rate ratio) with a material having a low dielectric constant, and being used as a material of which an interlayer insulating film is composed.

An organic silicon film acting as the above-mentioned electrically insulating film can be formed by the above-mentioned first or second film-fabrication method in accordance with the present invention.

Accordingly, the semiconductor device in accordance with the present invention makes it possible to reduce a capacity to be formed between wires, and reduce a current leaking from wire, even when integration of a circuit element is enhanced.

In order to accomplish the above-mentioned third object, the present invention provides a method of fabricating a semiconductor device, including a first step of preparing a semiconductor substrate or a semiconductor layer on which at least one circuit element is fabricated; and a second step of forming a multi-layered wire structure on the semiconductor substrate or the semiconductor layer such that the multi-layered wire structure is electrically connected to the at least one circuit element, characterized in that the second step includes a sub-step of forming an organic silicon film as an interlayer insulating film or as an electrically insulating film other than an interlayer insulating film, the organic silicon film is formed in the sub-step by carrying out chemical vapor deposition with organic silicon compound being used as a raw material gas, the organic silicon compound containing at least silicon, hydrogen and carbon as a constituent thereof, and containing two or more groups having unsaturated bond, per a molecule thereof, the raw material gas being used in mixture with a silicon hydride gas in the chemical vapor deposition.

In order to accomplish the above-mentioned third object, the present invention further provides a method of fabricating a semiconductor device, including a first step of preparing a semiconductor substrate or a semiconductor layer on which at least one circuit element is fabricated; and a second step of forming a multi-layered wire structure on said semiconductor substrate or said semiconductor layer such that said multi-layered wire structure is electrically connected to said at least one circuit element, characterized in that said second step includes a sub-step of forming an organic silicon film as an interlayer insulating film or as an electrically insulating film other than an interlayer insulating film, said organic silicon film is formed in said sub-step by carrying out chemical vapor deposition with organic silicon compound being used as a raw material gas, said organic silicon compound containing at least silicon, hydrogen and carbon as a constituent thereof, and containing one or more cyclic group having unsaturated bond, per a molecule thereof, said raw material gas being used in mixture with a silicon hydride gas in said chemical vapor deposition As explained above, the method of fabricating an organic silicon film, in accordance with the present invention, provides an organic silicon film having a low dielectric constant, and causing a leakage current small.

Furthermore, the semiconductor device and the method of fabricating the same, both in accordance with the present invention, make it possible to reduce a capacity to be formed between wires, and reduce a current leaking from wires.

Accordingly, it is possible to provide a semiconductor device having high integration of circuit elements, and further presenting high performance as entirety thereof.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 1 is a block diagram illustrating an example of a plasma-enhanced CVD apparatus used for formation of an organic silicon film in accordance with the first film-fabrication method in accordance with the present invention.

FIG. 2 is a block diagram illustrating an example of a gas supplier to be added to the plasma-enhanced CVD apparatus illustrated in FIG. 1.

FIG. 3 is a graph showing an example of a relation between an atomic number ratio and an etching rate of silicon atoms (Si) and carbon atoms (C) in the organic silicon film fabricated in accordance with the first film-fabrication method in accordance with the present invention.

FIG. 4 is a cross-sectional view of a semiconductor device in accordance with the first exemplary embodiment of the present invention.

FIG. 5 is a cross-sectional view of a semiconductor device in accordance with the second exemplary embodiment of the present invention.

FIGS. 6A to 6E are cross-sectional views each showing a respective step of a process of forming an organic silicon film.

DESCRIPTION OF THE EXEMPLARY EMBODIMENTS

Hereinbelow, the method of fabricating an organic silicon film in accordance with the present invention (the first and second film-fabrication methods in accordance with the present invention), the semiconductor device in accordance with the present invention, and the method of fabricating a semiconductor device in accordance with the present invention are explained with reference to drawings.

First Exemplary Embodiment

The first exemplary embodiment relates to a method of fabricating an organic silicon film, in accordance with the present invention (the first film-fabrication method in accordance with the present invention).

As mentioned above, in the first film-fabrication method in accordance with the present invention, an organic silicon film is formed by chemical vapor deposition through the use of organic silicon compound as a raw material gas. The organic silicon compound contains at least silicon, hydrogen and carbon as a constituent thereof, and further contains two or more groups having unsaturated bond, per a molecule thereof. In addition, the organic silicon compound is used in mixture with a silicon hydride gas. When an organic silicon film is actually formed, a carrier gas or a gas for dilution is used for feeding a raw material gas into a reactor. If necessary, a desired gas (or gases) may be additionally used.

Hereinbelow, a raw material gas, a silicon hydride gas, a carrier gas or a gas for dilution, and an additionally used gas are explained in an order, and thereafter, an example of a method of fabricating an organic silicon film is explained with reference to drawings.

(1) Raw Material Gas

As mentioned above, organic silicon compound to be used as a raw material gas in the first film-fabrication method in accordance with the present invention contains at least silicon, hydrogen and carbon as a constituent thereof, and contains two or more groups having unsaturated bond, per a molecule thereof.

It is preferable that the organic silicon compound consists of totally three elements, that is, silicon, hydrogen and carbon. However, the organic silicon compound may additionally contain other elements as a constituent thereof, such as aluminum, hafnium or zirconium.

As an example of the above-mentioned organic silicon compound, there is compound expressed with the formula (IA) or (IB).

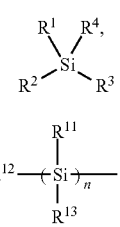
(IA)

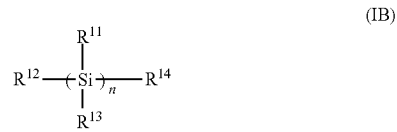
(IB)

("n" indicates an integer equal to or greater than 2)

At least one of the groups $R^1$ to $R^4$ shown in the formula (IA) or at least one of the groups $R^{11}$ to $R^{14}$ shown in the formula (IB) is any one of the groups expressed with the formulas (i-1) to (i-21).

As another example of the above-mentioned organic silicon compound, there is compound expressed with the formula (IIA) or (IIB).

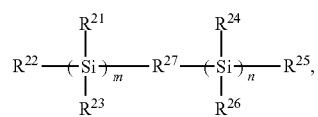
(IIA)

(each of "m" and "n" indicates an integer equal to or greater than 1)

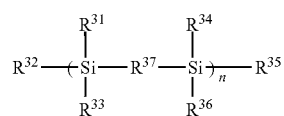
(IIB)

("n" indicates an integer equal to or greater than 2)

At least two of the groups $R^{21}$ to $R^{26}$ shown in the formula (IIA) or at least two of the groups $R^{31}$ to $R^{36}$ shown in the formula (IIB) is any one of the groups expressed with the formulas (i-1) to (i-21), and the group $R^{27}$ shown in the formula (IIA) or the group $R^{37}$ shown in the formula (IIB) is oxygen atom or any one of the groups expressed with the formulas (ii-1) to (ii-20).

(ii-1)

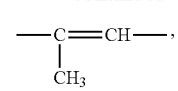
(ii-2)

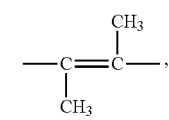
(ii-3)

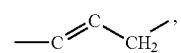
(ii-4)

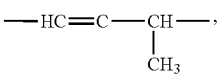
(ii-5)

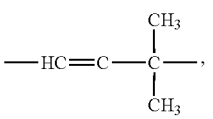
(ii-6)

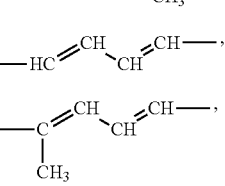
(ii-7)

(ii-8)

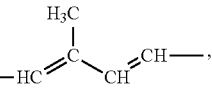
(ii-9)

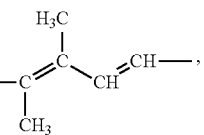
(ii-10)

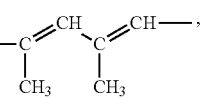
(ii-11)

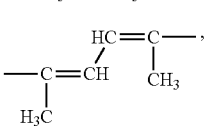
(ii-12)

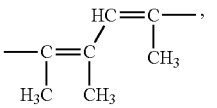
(ii-13)

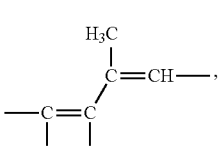
(ii-14)

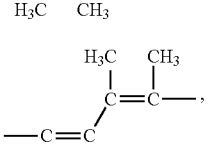
(ii-15)

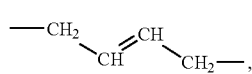
(ii-16)

-continued

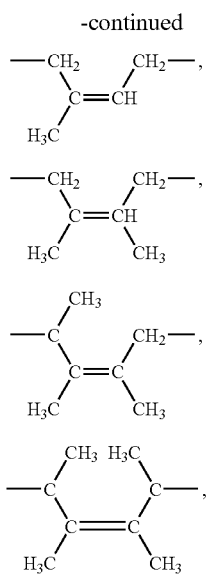

In the organic silicon compound expressed with the formula (IA), it is necessary that at least two of the groups $R^1$ to $R^4$ are any one of the groups expressed with the formulas (i-1) to (i-21). However, considering both polymerization and vaporization characteristics, it is preferable that any two of the groups $R^1$ to $R^4$ are any one of the groups expressed with the formulas (i-1) to (i-21).

If only one of the groups $R^1$ to $R^4$ is the group expressed with the formulas (i-1) to (i-21), there would be generated dimer. If at least three of the groups $R^1$ to $R^4$ are the group expressed with the formulas (i-1) to (i-21), polymerization is likely to proceed while the organic silicon compound is being vaporized, and hence, it may be difficult to successively form a film. If a number of groups other that the groups expressed with the formulas (i-1) to (i-21) is increased, and hence, a molecular weight of monomer is increased, a vapor pressure would be reduced, and thus, the organic silicon compound would be difficult to vaporize.

If the organic silicon compound expressed with the formula (IA) contains a group other than the groups expressed with the formulas (i-1) to (i-21), it is preferable that the group is hydrogen atom (H) or alkyl group having a carbon number equal to or smaller than 4. A group containing carbon atoms bonded to one another in a straight chain, such as pentyl group ($-C_5H_{11}$) has a high molecular weight, and facilitates organic silicon compound to be decomposed by plasma. Accordingly, such a group is not preferable as a group other than the groups expressed with the formulas (i-1) to (i-21).

It is preferable that the groups $R^1$ to $R^4$ are selected such that the organic silicon compound has a molecular weight equal to or smaller than 400.

The same as mentioned above is applied to the groups $R^{11}$ to $R^{14}$ contained in the organic silicon compound expressed with the formula (IB).

In the organic silicon compound expressed with the formula (IIA), it is necessary that at least two of the groups $R^{21}$ to $R^{26}$ are any one of the groups expressed with the formulas (i-1) to (i-21). However, considering both polymerization and vaporization characteristics, it is preferable that any two of the groups $R^{21}$ to $R^{26}$ are any one of the groups expressed with the formulas (i-1) to (i-21).

If a number of groups other that the groups expressed with the formulas (i-1) to (i-21) is increased, and hence, a molecular weight of the organic silicon compound is increased, a vapor pressure would be reduced, and thus, the organic silicon compound would be difficult to vaporize.

If the organic silicon compound expressed with the formula (IIA) contains a group other than the groups expressed with the formulas (i-1) to (i-21), it is preferable that the group is hydrogen atom (H) or alkyl group having a carbon number equal to or smaller than 4.

The same as mentioned above is applied to the groups $R^{31}$ to $R^{36}$ contained in the organic silicon compound expressed with the formula (IIB).

If organic silicon compound contains two or more groups expressed with the formulas (i-1) to (i-21), per a molecule thereof, when an organic silicon film is formed by chemical vapor deposition through the use of the organic silicon compound as a raw material gas, π-bond which is dissociated at low energy acts as a reactive part, and hence, an organic SiC film having a three-dimensional network structure is formed by addition polymerization which occurs among molecules. Since a silicon hydride gas is used in mixture with the above-mentioned organic silicon compound, hydrogen ions (protons) are dissociated from a silicon hydride gas during the organic SiC film is being formed, and act as electrophilic reagent. As a result, reactivity in each of two or more unsaturated bonds contained in the organic silicon compound per a molecule thereof is enhanced, and accordingly, it is difficult for non-bonding hands and non-reacted unsaturated bonds to remain in the film.

As a result, it is possible to have an organic silicon film having a high strength, a high resistance to heat and a low dielectric constant, and reducing current leakage.

Since there is formed an organic silicon film principally by addition polymerization without bonds other than π-bond being broken, it would be readily possible to control a composition of a resultant film.

For instance, if an organic SiC film is formed by plasma-enhanced chemical vapor deposition in which the organic silicon compound expressed with the formula (IA) including the groups $R^1$ to $R^4$ all expressed with the formula (i-1), that is, tetravinyl silane expressed with the formula (Ia) is used as a raw material gas in mixture with a silicon hydride gas, unsaturated bond (double bonds of carbon atoms) existing in a vinyl group is excited by the plasma, and receives thermal energy, resulting in that the reaction expressed with the formula (CR1) occurs.

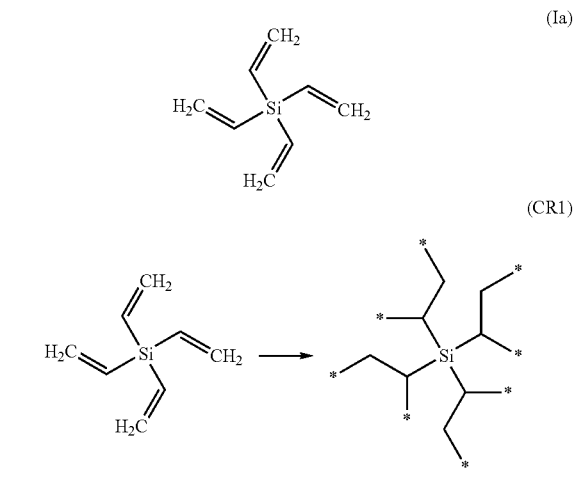

Actually, the reaction such as expressed with the formula (CR1) successively occurs in the plasma or at a surface of a substrate (a surface of an object on which an organic SiC film is to be formed), and accordingly, reactive groups cause polymerization reaction. Thus, there is formed an organic silicon film (organic SiC film) expressed with the formula (I-P) and having a three-dimensional network structure.

For instance, in accordance with the measurement by Raman analysis, it is possible to reduce an amount of vinyl bonds existing in a resultant organic silicon film, to a half or below of an amount of vinyl bonds existing in an organic silicon film formed without using a silicon hydride gas.

The symbol "*" in the formulas (CR1) and (I-P) indicates a non-bonding hand. Similarly, the symbol "*" in the later-mentioned formulas (CR2), (CR3), (CR4) and (IV-P) indicates a non-bonding hand.

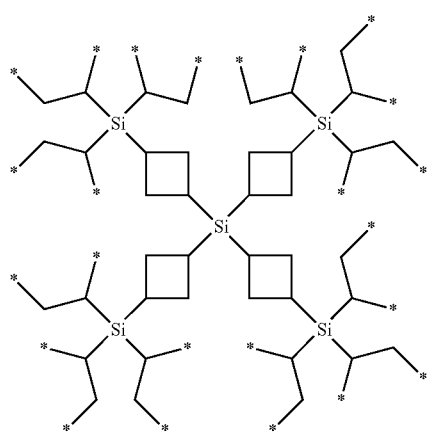

(I-P)

For instance, if an organic SiC film is formed by plasma-enhanced chemical vapor deposition in which the organic silicon compound expressed with the formula (IB) including the groups $R^{11}$ to $R^{13}$ being all methyl groups, and the groups $R^{12}$ to $R^{14}$ being the group expressed with the formula (i-1), wherein "n" is equal to 2, that is, the compound expressed with the formula (Ib) is used as a raw material gas in mixture with a silicon hydride gas, unsaturated bond (double bonds of carbon atoms) existing in the group expressed with the formula (i-1) is excited by the plasma, and receives thermal energy, resulting in that the reaction expressed with the formula (CR2) occurs.

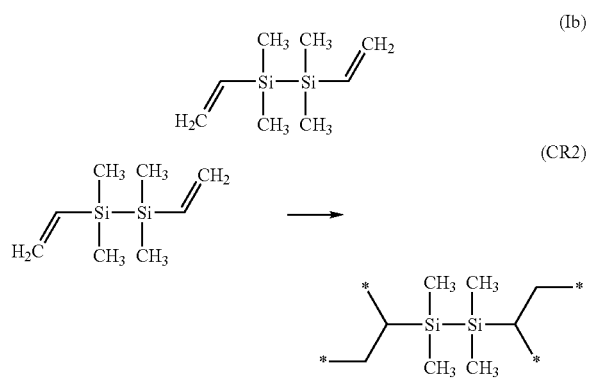

Actually, the reaction such as expressed with the formula (CR2) successively occurs in the plasma or at a surface of a substrate (a surface of an object on which an organic SiC film is to be formed), and accordingly, reactive groups cause polymerization reaction. Thus, there is formed an organic silicon film (organic SiC film) having a three-dimensional network structure.

If an organic SiC film is formed by plasma-enhanced chemical vapor deposition in which the organic silicon compound expressed with the formula (IIA) including the groups $R^{21}$, $R^{23}$, $R^{24}$ and $R^{26}$ being all methyl groups, the groups $R^{22}$ and $R^{25}$ being the group expressed with the formula (i-1), and the group $R^{27}$ being the group expressed with the formula (ii-1), wherein each of "m" and "n" is equal to 1, that is, the compound expressed with the formula (IIa) is used as a raw material gas in mixture with a silicon hydride gas, unsaturated bond (double bonds of carbon atoms) existing in the group expressed with the formula (i-1) and unsaturated bond (double bonds of carbon atoms) existing in the group expressed with the formula (ii-1) are excited by the plasma, and receive thermal energy, resulting in that the reaction expressed with the formula (CR3) occurs.

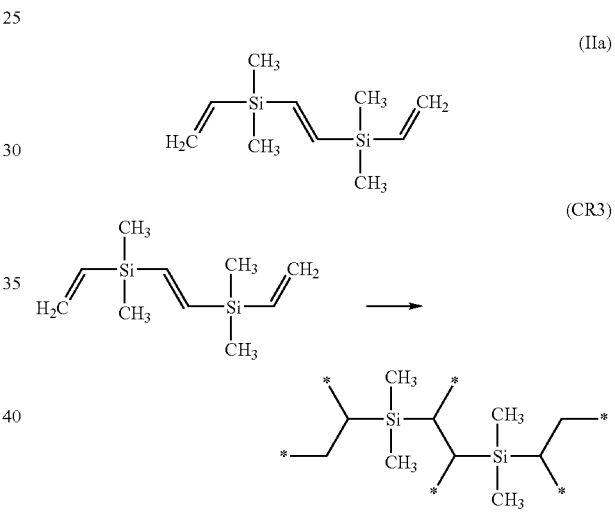

Actually, the reaction such as expressed with the formula (CR3) successively occurs in the plasma or at a surface of a substrate (a surface of an object on which an organic SiC film is to be formed), and accordingly, reactive groups cause polymerization reaction. Thus, there is formed an organic silicon film (organic SiC film) having a three-dimensional network structure.

The organic silicon compound used in the first film-fabrication method in accordance with the present invention may contain oxygen atoms (O) as a constituent thereof. However, if an atomic number ratio of oxygen atoms in a resultant organic silicon film is high, oxidation of a copper wire is facilitated, in particular, when an organic silicon film is formed on a copper wire, resulting in a problem of an increase in a resistance. Accordingly, it is preferable that organic silicon compound used as a raw material gas does not contain oxygen atoms (O) as a constituent thereof.

As a raw material gas, there my be used only one kind of organic silicon compound, or there may be used two or more kinds of organic silicon compounds, in which case, a molecular structure is not limited to a specific one in dependence on a geometrical isomer or an optical isomer.

By using two or more kinds of organic silicon compounds, it is possible to readily control a composition of a resultant organic silicon film, and furthermore, it is also possible to readily control a dielectric constant of a resultant organic silicon film, and current leakage in a resultant organic silicon film.

Since characteristics of a resultant organic silicon film vary in dependence on an atomic number ratio between silicon atoms (Si) and carbon atoms (C) in a resultant organic silicon film, it is preferable to select a composition of a raw material gas, and a number of raw material gases.

A relation between an atomic number ratio and characteristics in an organic silicon film will be explained after a method of fabricating an organic silicon film was explained.

(2) Silicon Hydride Gas

A silicon hydride gas to be used in mixture with the above-mentioned organic silicon compound in the first film-fabrication method in accordance with the present invention acts as a hydrogen ion source which effectively generates hydrogen ions (protons) by virtue of energy generated while an organic silicon film is being formed, since bonding energy between silicon atom (Si) and hydrogen atom (H) is relatively low. The thus generated hydrogen ions act as electrophilic reagent to thereby enhance reactivity of the above-mentioned organic silicon compound.

While an organic silicon film is being formed, silicon atoms are generated out of a silicon hydride gas. Since silicon atom is one of constituents of an organic silicon film (organic SiC film), silicon atom does not degrade a organic silicon film quality, even if silicon atom is absorbed into the film.

As examples of a silicon hydride gas, there are a mono-silane gas such as mono-silane, a disilane gas such as disilane, and a mixture gas of a mono-silane gas and a disilane gas.

When a volume formed between electrodes in a reactor used for forming an organic silicon film is about 700 cm$^3$, it is possible to select a volume of a silicon hydride gas to be supplied into the reactor, within a volume about 0.1 to about 5 times larger than a flow rate of a raw material gas.

By using a raw material gas in mixture with a silicon hydride gas when an organic silicon film is formed on a metal layer, it is possible to turn a surface of the metal layer into silicide by virtue of a silicon hydride gas. This ensures enhancement in adhesion between the organic silicon film and the metal layer.

(3) Carrier Gas or Gas for Dilution

As a carrier gas or a gas for dilution used when an organic silicon film is formed in accordance with the first film-fabrication method in accordance with the present invention, there is used a gas inert to organic silicon compound used as a raw material gas. For example, there may be used helium (He) gas, argon (Ar) gas, and neon (Ne) gas.

When a volume formed between electrodes in a reactor used for forming an organic silicon film is about 700 cm$^3$, it is possible to select a volume of a carrier gas or a gas for dilution to be supplied into the reactor, within a volume about 3 to about 100 times larger than a flow rate of a raw material gas.

(4) Additional Gas

In the first film-fabrication method in accordance with the present invention, there may be used an additional gas, if necessary.

As an example of such an additional gas, there is cyclic organic compound, such as mesitylene or benzene, which opens at a high rate unsaturated bonds existing in organic silicon compound to thereby facilitate formation of porous organic silicon film.

(5) Film-Fabrication Method (Method of Fabricating an Organic Silicon Film)

In the first film-fabrication method in accordance with the present invention, an organic silicon film is formed by chemical vapor deposition such as plasma-enhanced CVD, thermal CVD or plasma-enhanced polymerization. The first film-fabrication method in accordance with the present invention is mainly characterized in that the above-mentioned raw material gas is used in mixture with a silicon hydride gas. As an apparatus for fabricating an organic silicon film, there may be various apparatuses which operate in accordance with chemical vapor deposition.

An example of an apparatus for fabricating an organic silicon film, to be used when an organic silicon film is fabricated in accordance with the first film-fabrication method in accordance with the present invention, is explained hereinbelow with reference to drawings.

FIG. 1 is a block diagram of an example of a plasma-enhanced CVD to be used when an organic silicon film is fabricated in accordance with the first film-fabrication method in accordance with the present invention.

A plasma-enhanced CVD apparatus 50 illustrated in FIG. 1 is preferably used when each of organic silicon compound used as a raw material gas and a silicon hydride gas has a low boiling point, and those are able to be reserved in gaseous condition.

The plasma-enhanced CVD apparatus 50 includes a reactor 10, a gas supplier 20, a vacuum pump 30, and a high-frequency power source 40.

The gas supplier 20 is connected to the reactor 10 through a gas supply pipe 22. The vacuum pump 30 is connected to the reactor 10 through a gas exhaust pipe 36. A valve 32 and a cooling trap 34 are arranged in the gas exhaust pipe 36 between the reactor 10 and the vacuum pump 30.

The high-frequency power source 40 is electrically connected to the reactor 10 through a high-frequency cable 44. A matching box 42 is arranged in the high-frequency cable 44 between the reactor 10 and the high-frequency power source 40.

In the reactor 10, a substrate heater 3 for holding an object on which a film is formed, such as a semiconductor substrate, and heating the object is disposed in facing relation with a shower head 5 connected to the gas supply pipe 22 and acting as a gas spray unit.

The substrate heater 3 is grounded through an earth cable 7. The shower head 5 is electrically connected to the high-frequency power source 40 through the high-frequency cable 44.

A raw material gas and a silicon hydride gas are supplied in mixed condition to the shower head 5 through the gas supply pipe 20 from the gas supplier 20. The matching box 42 arranged in the high-frequency cable 44 changes a frequency of high-frequency power generated by the high-frequency power source 40 into a predetermined frequency, and then, the high-frequency power is supplied to the shower head 5. Thus, a gas existing in a space between the substrate heater 3 and the shower head 5 is turned into plasma.

The gas supplier 20 in the plasma-enhanced CVD apparatus 50 illustrated in FIG. 1 includes a single raw material gas supply tank 11, a single silicon hydride gas supply tank 13, a single carrier gas supply tank 15, and a mixer 19 for mixing gases supplied from the tanks 11, 13 and 15, to one another.

A number of each of the tanks arranged in the gas supplier 20 is not to be limited to one. In general, the gas supplier 20 is comprised of raw material gas supply tanks in a number corresponding to a number of used raw material gases, silicon hydride gas supply tanks in a number corresponding to a number of used silicon hydride gases, and carrier gas supply tanks in a number corresponding to a number of carrier gases or gases for dilution.

Though not illustrated in FIG. 1, when an additional gas is to be used, the gas supplier is designed to additionally include additional gas supply tanks in a number corresponding to a number of used additional gases.

The raw material gas supply tank 11 is in fluid-communication with the mixer 19 through a pipe 12. The silicon hydride gas supply tank 13 is in fluid-communication with the mixer 19 through a pipe 14. The carrier gas supply tank 15 is in fluid-communication with the mixer 19 through a pipe 16.

A flow-rate controller 18 is arranged in each of the pipes 12, 14 and 16 between the tanks 11, 13 and 15, and the mixer 19, respectively. The flow-rate controller 18 is comprised of a valve 18a connected to the tank 11, 13 or 15, a flow-rate control unit 18c connected to the valve 18a, and a valve 18c connected to both the flow-rate control unit 18c and the mixer 19.

The gas supply pipe 22 is connected at an end thereof to the mixer 19.

A cleaning gas supply pipe 28 through which a cleaning gas is supplied is connected to the gas supply pipe 22. A flow rate controller 24 and a valve 26 are arranged in the cleaning gas supply pipe 28.

A waste-liquid pipe 38 branches from the gas exhaust pipe 36 between the valve 32 and the cooling trap 34.

It is preferable to arrange a heater (not illustrated) around each of the pipes 12, 14 and 16 arranged in the gas supplier 20, and further around the gas supply pipe 22 for heating the pipes 12, 14 and 16, and the gas supply pipe 22 in order to prevent a gas from liquidizing while being fed.

Similarly, it is preferable to arrange a heater (not illustrated) around the reactor 10 for heating the reactor 10.

Hereinbelow is explained a process of fabricating an organic silicon film by means of the plasma-enhanced CVD apparatus 50.

First, the object 1 on which an organic silicon film is to be fabricated, such as a semiconductor substrate, is placed on the substrate heater 3. Then, the vacuum pump 30 is operated with the valve 32 being open to thereby set an initial degree of vacuum in the reactor 10 to be a few mTorr (a few dPa), for instance.

Moisture existing in a gas exhausted out of the reactor 10 is removed by the cooling trap 34.

Then, a raw material gas (gaseous organic silicon compound) and a silicon hydride gas in mixture are supplied to the reactor 10 together with a carrier gas or a gas for dilution from the gas supplier 20. Simultaneously, the high-frequency power source 40 and the matching box 42 are operated to thereby supply high-frequency power having a predetermined frequency, to the shower head 5 in the reactor 10.

Each of the gases are controlled with respect to a flow rate thereof by the associated flow-rate controller 18, and is mixed together in the mixer 19 into a mixture gas having a predetermined composition. Then, the mixture gas is supplied to the reactor 10. Since a rate (a volume to be supplied) of a silicon hydride gas to a raw material gas and a rate (a volume to be supplied) of a carrier gas or a gas for dilution to a raw material gas have been already explained, they are not explained here.

It is preferable that a partial pressure of a raw material gas in the reactor 10 is selected within a pressure in the range of about 0.01 to about 1 Torr (about 1.333 to about 133.3 Pa). Furthermore, it is preferable that a partial pressure of a silicon hydride gas is selected within a pressure in the range of about 0.01 to about 1 Torr (about 1.333 to about 133.3 Pa) in dependence of a sort thereof.

It is preferable that an atmospheric pressure in the reactor 10 while an organic silicon film is being formed is in the range of about 1 to about 5 Torr (about 133.3 to about 666.5 Pa) by controlling operation of the vacuum pump 30.

It is preferable that a temperature at a surface of the object 1 while an organic silicon film is being formed is in the range of 100 to 400 degrees centigrade by heating the object 1 by means of the substrate heater 3.

By forming an organic silicon film under the above-mentioned conditions, molecules of organic silicon compound as a raw material gas are excited by plasma, and reaches a surface of the object 1 in an activated condition. Then, the molecules further receive thermal energy from the substrate heater 3, resulting in that unsaturated bonds are made open, and thermal polymerization three-dimensionally progresses among the molecules, in which case, since hydrogen ions (protons) are dissociated from a silicon hydride gas, and act as electrophilic reagent, unsaturated bonds contained two or more in a molecule of organic silicon compound would have enhanced reactivity, and hence, it is difficult for non-bonding hands and non-reacted unsaturated bonds to remain in a resultant film.

As a result, there can be readily obtained an organic silicon film having a high strength, a high resistance to heat, and a low dielectric constant, and reducing current leakage.

There may be used a nitrogen trifluoride ($NF_3$) gas, a sulfur hexafluoride ($SF_6$) gas, a tetrafluoromethane ($CF_4$) gas, or a hexafluoroethan ($C_2F_6$) gas for cleaning the reactor 10, for instance. These gases may be mixed with another gas such as an oxygen gas or an ozone gas, if necessary.

A cleaning gas is supplied into the reactor 10 through the cleaning gas supply pipe 28. Similarly to the formation of an organic silicon film, high-frequency power is applied across the shower head 5 and the substrate heater 3 to thereby generate plasma for cleaning the reactor 10. It is also effective to use a cleaning gas which was in advance turned into plasma by means of remote plasma.

The above-mentioned plasma-enhanced CVD apparatus 50 can be preferably used when organic silicon compound as a raw material gas and a silicon hydride gas have a low boiling point, and they can be readily reserved in gaseous condition. If organic silicon compound as a raw material gas has a low boiling point, and hence, is liquidized if not heated, it is preferable that the plasma-enhanced CVD apparatus 50 includes a gas supplier which first vaporizes organic silicon compound, and then, mixes the thus vaporized organic silicon compound with a silicon hydride gas.

FIG. 2 is a block diagram of such a gas supplier.

The gas supplier 150 illustrated in FIG. 2 includes two vaporization control units VU1 and VU2 each first mixing liquid organic silicon compound with a carrier gas or a gas for dilution, and then, vaporizing the organic silicon compound, a gas supply tank 130 reserving a silicon hydride gas therein, and a mixer 140 which receives a mixture gas of a carrier gas or a gas for dilution and the vaporized organic silicon compound, from the vaporization control units VU1 and VU2, and further receives a silicon hydride gas from the gas supply tank 130, and mixes the received gases with each other.

The vaporization control units VU1 and VU2 have the same structure as each other, and each of them is comprised a raw material tank 102 reserving liquid organic silicon compound 100 therein, a pressurized gas supplier 106 which supplies a pressurized gas into the raw material tank 102 through a pressurized gas supply pipe 104, a raw material compound feeding pipe 108 having an end inserted into the raw material tank 102, a flow rate control unit 110 connected to the other end of the raw material compound feeding pipe 108, a vaporizing unit 112 connected to the flow rate control unit 110, a gas supply tank 114 reserving a carrier gas or a gas for dilution (hereinafter, called "carrier gas supply tank"), a pipe 116 through which a carrier gas or a gas for dilution reserved in the carrier gas supply tank 114 is fed to the vaporizing unit 112, and a flow rate control unit 118 arranged in the pipe 116 between the carrier gas supply tank 114 and the vaporizing unit 112.

The flow rate control unit 110 is comprised of a valve 110a connected to the raw material compound feeding pipe 108, a flow rate controller 110c connected to the valve 110a, and a valve 110b connected to both the flow rate control unit 110c and the vaporizing unit 112

The vaporizing unit 112 is comprised of a valve 112a connected to both the flow rate control unit 110 and the flow rate control unit 118, and a vaporizer 112b connected to both the valve 112a and the mixer 140.

The flow rate control unit 118 is comprised of a valve 118a connected to the carrier gas supply tank 114, a flow rate controller 118c connected to the valve 118a, and a valve 118b connected to both the flow rate controller 118c and the vaporizing unit 112.

By supplying a pressurized gas into the raw material tank 102 from the pressurized gas supplier 106 through the pressurized gas supply pipe 104, an internal pressure of the raw material tank 102 is increased, and thus, the liquid organic silicon compound 100 reserved in the raw material tank 102 is fed towards the vaporizing unit 112 through the raw material compound feeding pipe 108. After having mixed with a carrier gas or a gas for dilution supplied from the carrier gas supply tank 114, the liquid organic silicon compound 100 reaches the vaporizing unit 112.

The liquid organic silicon compound 100 having reached the vaporizing unit 112 is vaporized in the vaporizing unit 112 due to reduction in a pressure at an inlet of the vaporizing unit 112, and thermal energy supplied by a heater (not illustrated).

A gas generated in the vaporization control unit VU1 is fed to a gas exhaust pipe 120 connected to the vaporizing unit 112, and a gas generated in the vaporization control unit VU2 is fed to a gas exhaust pipe 122 connected to the vaporizing unit 112. Both the gas fed to the gas exhaust pipe 120 and the gas fed to the gas exhaust pipe 122 reach the mixer 140 through a pipe 124.

Valves 120a and 122a are arranged in the gas exhaust pipes 120 and 122, respectively. A valve 124a is arranged in the pipe 124.

The mixer 140 is connected to the silicon hydride gas supply tank 130 through a pipe 132. A flow rate control unit 134 is arranged in the pipe 132 between the silicon hydride gas supply tank 130 and the mixer 140.

The flow rate control unit 134 is comprised of a valve 134a connected to the silicon hydride gas supply tank 130, a flow rate controller 134c connected to the valve 134a, and a valve 134b connected to both the flow rate controller 134c and the mixer 140.

A silicon hydride gas supplied from the silicon hydride gas supply tank 130 is controlled by the flow rate control unit 134 with respect to a flow rate thereof, and then, is fed to the mixer 140. In the mixer 140, a silicon hydride gas is mixed with gases (a raw material gas and a carrier gas or a gas for dilution) supplied from the vaporization control units VU1 and VU2.

A mixture gas generated in the mixer 140 is fed to the reactor through a gas supply pipe 152.

A valve 152a is arranged in the gas supply pipe 152 between the mixer 140 and the reactor 10.

A vent line 142 branches from the gas supply pipe 152 between the mixer 140 and the valve 152a. A valve 142a is arranged in the vent line 142.

In order to smoothly carry out vaporization in each of the vaporizing units 112, it is preferable to arrange a heater around the raw material compound feeding pipe 108 downstream of the valve 110c of the flow rate control unit 110 for heating the raw material compound feeding pipe 108.

Similarly, in order to prevent gases from liquidizing, it is preferable to arrange a heater around the gas exhaust pipes 120 and 122, the pipe 132 and the mixer 140 for heating them.

By using a film-fabrication apparatus including the gas supplier 150 having the above-mentioned structure, even if organic silicon compound to be used as a raw material gas has a low boiling point, and organic silicon compound is liquidized if not heated, it would be possible to readily have a desired organic silicon film.

If it is difficult to vaporize organic silicon compound to be used as a raw material gas, the organic silicon compound might be dissolved into organic solvent to thereby reduce a partial pressure of the organic silicon compound, and the resultant solution might be fed to the vaporizing unit 112 for vaporization.

The gas supplier may be designed to mix organic silicon compound and a silicon hydride gas with each other upstream of the mixer 140. However, it is most preferable that those gases are mixed with each other in the mixer 140, as done so in the gas supplier 150 illustrated in FIG. 2.

Though not illustrated in FIG. 2, when additional gas(es) is(are) used, it is preferable to design the gas supplier so as to mix organic silicon compound and additional gas(es) with each other in the mixer 140, in comparison with designing the gas supplier so as to mix organic silicon compound and additional gas(es) with each other upstream of the mixer 140.

As mentioned above, the first film-fabrication method in accordance with the present invention for fabricating an organic silicon film provides an organic silicon film having a high strength, a high resistance to heat and a low dielectric constant, and reducing current leakage.

Such an organic silicon film as mentioned above can be preferably used as an electrically insulating barrier film formed together with a damascene wire, an etching stopper film formed when a through-hole is formed throughout an interlayer insulating film by etching, or a hard mask film mechanically protecting an interlayer insulating film, for instance.

As referred to in the explanation about a raw material gas, characteristics of an organic silicon film provided by the first film-fabrication method in accordance with the present invention vary in dependence on an atomic number ratio between silicon (Si) atoms and carbon (C) atoms in an organic silicon film.

For instance, an etching rate in dry etching varies in dependence on Y/X wherein X and Y are defined as Si:C=X:Y wherein "Si" indicates a number of silicon (Si) atoms existing in an organic silicon film fabricated in accordance with the first film-fabrication method in accordance with the present invention, and "C" indicates a number of carbon (C) atoms existing in an organic silicon film fabricated in accordance with the same.

FIG. 3 is a graph showing the above-mentioned ratio Y/X (expressed as "C/Si" in FIG. 3) and the above-mentioned etching rate.

When an interlayer insulating film comprised of a porous SiOCH film (an atomic number ratio Si:O:C=1:1:1) is formed on an electrically insulating barrier film, and a through-hole is formed throughout the interlayer insulating film by dry etching (etching gas is a mixture gas of a octafluorocyclobutane ($C_4F_8$) gas and an argon (Ar) gas), an etching selection ratio between the interlayer insulating film and the electrically insulating barrier film is desired to be equal to or greater than 10. As is obvious in view of FIG. 3, it is possible to have a sufficiently high etching selection ratio by selecting an atomic number ratio of silicon atoms (Si) and carbon atoms (C) such that the above-mentioned Y/X is greater than 3 in an organic silicon film fabricated in accordance with the first film-fabrication method in accordance with the present invention.

An atomic number ratio of silicon atoms (Si) and carbon atoms (C) in an organic silicon film can be determined by carrying out element analysis by EELS (Electron Energy-Loss Spectroscopy) or EDX (Energy-Dispersive X-ray Spectroscopy), for instance.

When an organic silicon film is formed on a metal layer, it is possible to distinguish the organic silicon film and the metal layer from each other in accordance with contrast of images taken by means of a transmission electron microscope (TEM), for instance.

Second Exemplary Embodiment

The second exemplary embodiment relates to a method of fabricating an organic silicon film, in accordance with the present invention (the second film-fabrication method in accordance with the present invention).

As mentioned earlier, in the second film-fabrication method in accordance with the present invention, an organic silicon film is formed by chemical vapor deposition through the use of organic silicon compound as a raw material gas. As such organic silicon compound, there is used compound containing at least silicon, hydrogen and carbon as a constituent thereof, and containing at least one cyclic group including unsaturated bond, per a molecule thereof. Furthermore, the organic silicon compound is used in mixture with a silicon hydride gas.

When an organic silicon film is actually formed, there is also used a carrier gas or a gas for dilution for supplying a raw material gas into a reactor. There may be used an additional gas(es), if necessary.

In the second film-fabrication method in accordance with the present invention, an organic silicon film is formed similarly to the first film-fabrication method in accordance with the present invention except that the above-mentioned organic silicon compound is used in place of the organic silicon compound having been used as a raw material gas in the first film-fabrication method in accordance with the present invention. Accordingly, organic silicon compound to be used as a raw material gas is explained hereinbelow, and other matters are not explained.

As mentioned above, organic silicon compound to be used as a raw material gas in the second film-fabrication method in accordance with the present invention contains at least silicon, hydrogen and carbon as a constituent thereof, and further contains one or more cyclic group including unsaturated bond, per a molecule thereof. Furthermore, the organic silicon compound is used in mixture with a silicon hydride gas. It is preferable that the organic silicon compound consists of totally three elements, that is, silicon, hydrogen and carbon, however, the organic silicon compound may additionally contain oxygen, aluminum, hafnium or zirconium as a constituent thereof.

As an example of the above-mentioned organic silicon compound, there is compound expressed with the formula (IIIA) or (IIIB).

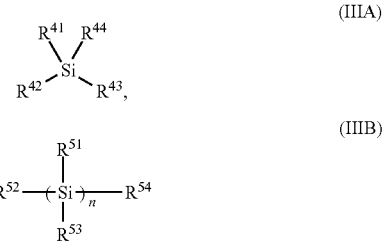

("n" indicates an integer equal to or greater than 2)

At least one of the groups $R^{41}$ to $R^{44}$ shown in the formula (IIIA) or at least one of the groups $R^{51}$ to $R^{54}$ shown in the formula (IIIB) is any one of the cyclic unsaturated hydrocarbon groups expressed with the formulas (iii-1) to (iii-5).

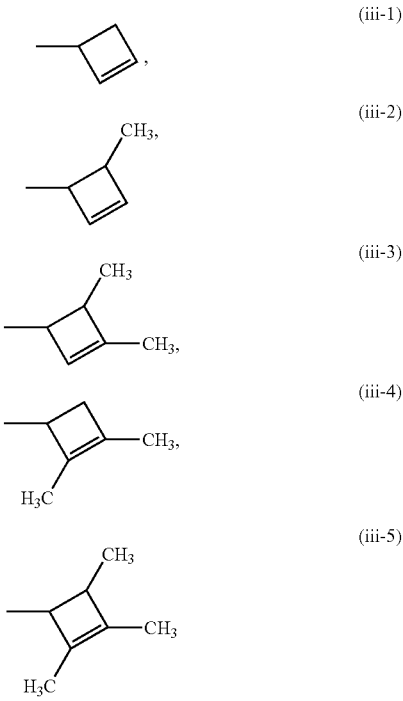

As another example of the above-mentioned organic silicon compound, there is compound expressed with the formula (IVA) or (IVB).

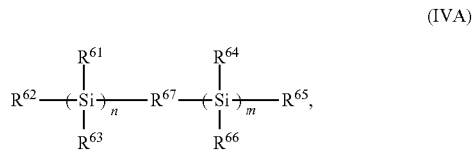

(each of "m" and "n" indicates an integer equal to or greater than 1)

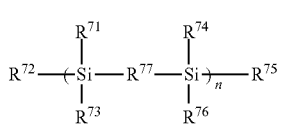

(IVB)

("n" indicates an integer equal to or greater than 1)

At least one of the groups $R^{61}$ to $R^{66}$ shown in the formula (IVA) or at least one of the groups $R^{71}$ to $R^{76}$ shown in the formula (IVB) is any one of the cyclic unsaturated hydrocarbon groups expressed with the formulas (iii-1) to (iii-5), the group expressed with the formula (iv-1) wherein the group $R^{67}$ shown in the formula (IVA) or the group $R^{77}$ shown the in formula (IVB) is oxygen atom, or any one of the groups expressed with the formulas (ii-1) to (ii-20).

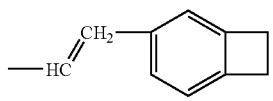

(iv-1)

In the organic silicon compound expressed with the above-mentioned formula (IIIA), at least one of the groups $R^{41}$ to $R^{44}$ is any one of the cyclic unsaturated hydrocarbon groups expressed with the formulas (iii-1) to (iii-5). However, for the same reason as the reason for the organic silicon compound expressed with the above-mentioned formula (IA), it is preferable that any two of the groups $R^{41}$ to $R^{44}$ is any one of the cyclic unsaturated hydrocarbon groups expressed with the formulas (iii-1) to (iii-5).

If organic silicon compound expressed with the formula (IIIA) contains a group other than a cyclic unsaturated hydrocarbon groups expressed with the formulas (iii-1) to (iii-5), it is preferable that the group is hydrogen (H) atom or an alkyl group having a carbon number equal to or smaller than 4. Since a group containing carbon atoms bonded to one another in a straight chain, such as pentyl group ($-C_5H_{11}$) has a high molecular weight, and facilitates organic silicon compound to be decomposed by plasma. Accordingly, such a group is not preferable as a group other than the cyclic unsaturated hydrocarbon groups expressed with the formulas (iii-1) to (iii-5).

The same as mentioned above is applied to the groups $R^{51}$ to $R^{54}$ contained in the organic silicon compound expressed with the formula (IIIB).

In the organic silicon compound expressed with the above-mentioned formula (IVA), at least one of the groups $R^{61}$ to $R^{66}$ is any one of the cyclic unsaturated hydrocarbon groups expressed with the formulas (iii-1) to (iii-5). However, for the same reason as the reason for the organic silicon compound expressed with the above-mentioned formula (IIA), it is preferable that any two of the groups $R^{61}$ to $R^{66}$ is any one of the cyclic unsaturated hydrocarbon groups expressed with the formulas (iii-1) to (iii-5) or a group expressed with the formula (iv-1).

If organic silicon compound expressed with the formula (IVA) contains a group other than both a cyclic unsaturated hydrocarbon groups expressed with the formulas (iii-1) to (iii-5) and a group expressed with the formula (iv-1), it is preferable that the group is hydrogen (H) atom or an alkyl group having a carbon number equal to or smaller than 4

The same as mentioned above is applied to the groups $R^{71}$ to $R^{76}$ contained in the organic silicon compound expressed with the formula (IVB).

If organic silicon compound contains either one or more cyclic unsaturated hydrocarbon group expressed with the formulas (iii-1) to (iii-5) or one or more group expressed with the formula (iv-1), per a molecule thereof, when an organic silicon film is formed by chemical vapor deposition through the use of the organic silicon compound as a raw material gas, π-bond which is dissociated at low energy acts as a reactive part, and hence, an organic SiC film having a three-dimensional network structure is formed by addition polymerization (electronic cyclic reaction) which occurs among molecules.

Since a silicon hydride gas is used in mixture with the above-mentioned organic silicon compound, hydrogen ions (protons) are dissociated from a silicon hydride gas during the organic SiC film is being formed, and act as electrophilic reagent. As a result, the above-mentioned cyclic unsaturated hydrocarbon group is open, and further, the groups expressed with the formulas (iii-1) to (iii-5) or the formula (iv-1) are open. Thus, reactivity to electronic cyclic reaction in which polymerization occurs among molecules is enhanced, and accordingly, it is difficult for non-bonding hands and non-reacted unsaturated bonds to remain in the resultant film.

As a result, the second film-fabrication method in accordance with the present invention provides an organic silicon film having a high strength, a high resistance to heat, and a low dielectric constant, and reducing current leakage.

Since there is formed an organic silicon film principally by addition polymerization without bonds other than π-bonds being broken, it would be readily possible to control a composition of a resultant film.

For instance, if an organic SiC film is formed by plasma-enhanced chemical vapor deposition in which the organic silicon compound expressed with the formula (IIIA) wherein the group $R^{44}$ is a cyclic unsaturated hydrocarbon group expressed with the formula (iii-1), and the groups $R^{41}$ to $R^{43}$ are all methyl groups, that is, the compound expressed with the formula (IIIa) is used as a raw material gas in mixture with a silicon hydride gas, unsaturated bond (double bonds of carbon atoms) existing in a cyclic unsaturated hydrocarbon group expressed with the formula (iii-1) is excited by the plasma, and receives thermal energy, resulting in that the ring-opening reaction expressed with the formula (CR4a) occurs.

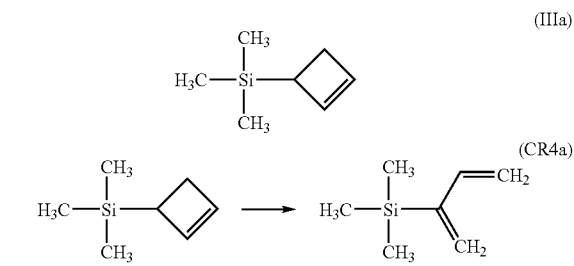

(IIIa)

(CR4a)

The above-mentioned unsaturated bond is further excited by the plasma, and further receives thermal energy, resulting in that the reaction expressed with the formula (CR4b) occurs.

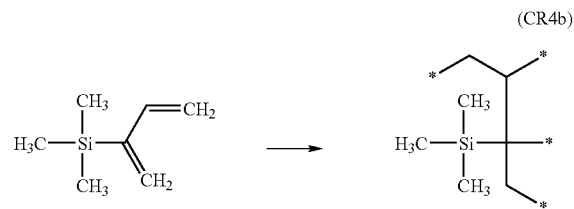

(CR4b)

Actually, the reaction such as expressed with the formula (CR4a) or (CR4b) successively occurs in the plasma or at a surface of a substrate (a surface of an object on which an organic SiC film is to be formed), and accordingly, molecules three-dimensionally cause polymerization reaction due to electronic cyclic reaction. Thus, there is formed an organic silicon film (organic SiC film) having a three-dimensional network structure.

For instance, if an organic SiC film is formed by plasma-enhanced chemical vapor deposition in which the organic silicon compound expressed with the formula (IVA) wherein the groups $R^{61}$, $R^{63}$, $R^{64}$ and $R^{66}$ are all methyl groups, each of the groups $R^{62}$ and $R^{65}$ is a group expressed with the formula (iv-1), the group $R^{67}$ is oxygen (O) atom, and each of "m" and "n" indicates 1, that is, divinylsiloxanebisbenzocyclobutene (DVS-BCB) expressed with the formula (IVa) is used as a raw material gas in mixture with a silicon hydride gas, vinyl groups and cyclobutene rings existing in a group expressed with the formula (iv-1) are excited by the plasma, and receive thermal energy, resulting in that addition polymerization reaction occurs among molecules.

As a result, there is formed an organic silicon film (organic SiC film) composed of polymer expressed with the formula (IV-P).

when an organic silicon film is formed on a copper wire, resulting in a problem of an increase in a resistance.

As a raw material gas, there my be used only one kind of organic silicon compound, or there may be used two or more kinds of organic silicon compounds, in which case, a molecular structure is not limited to a specific one in dependence on a geometrical isomer or an optical isomer. By using two or more kinds of organic silicon compounds, it is possible to readily control a composition of a resultant organic silicon film.

Furthermore, it is also possible to readily control a dielectric constant of a resultant organic silicon film, and further, readily control current leakage in a resultant organic silicon film.

Since characteristics of a resultant organic silicon film vary in dependence on an atomic number ratio between silicon atoms (Si) and carbon atoms (C) in a resultant organic silicon film, as mentioned in the description about the first film-fabrication method in accordance with the present invention, it is preferable to select a composition of a raw material gas, and a number of raw material gases.

Similarly to an organic silicon film fabricated in accordance with the first film-fabrication method in accordance with the present invention, an organic silicon film fabricated

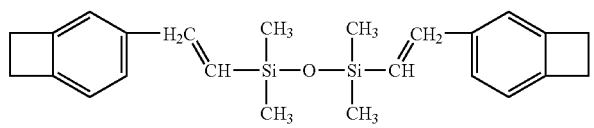

(IVa)

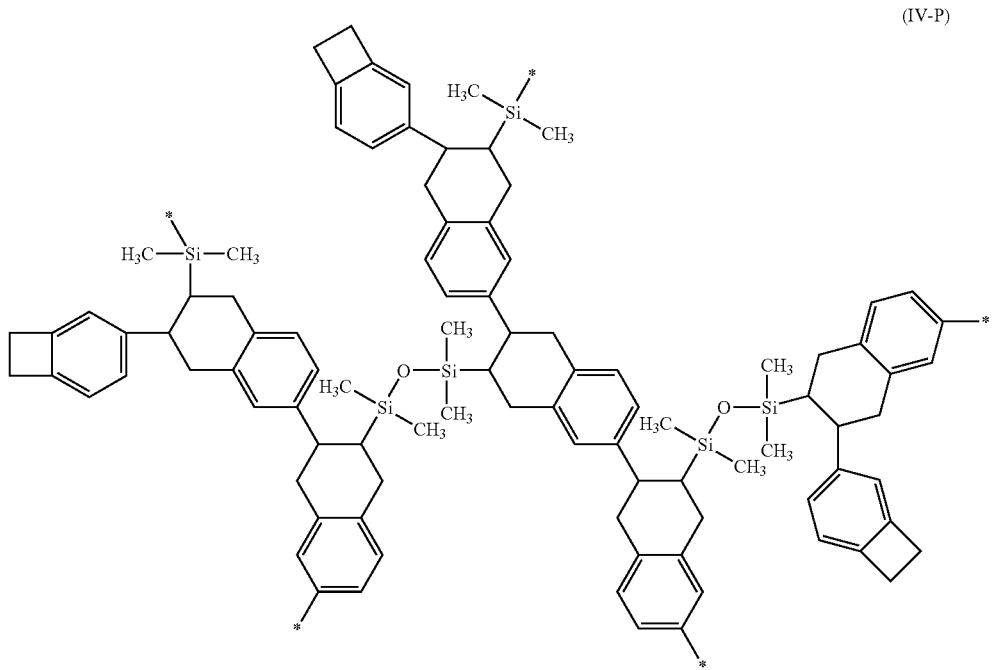

(IV-P)

Organic silicon compound used in the second film-fabrication method in accordance with the present invention may contain oxygen (O) atom as a constituent thereof, for instance, as the organic silicon compound is composed of the above-mentioned DVS-BCB. However, if an atomic number ratio of oxygen atoms in a resultant organic silicon film is great, oxidation of a copper wire is facilitated, in particular, in accordance with the second film-fabrication method in accordance with the present invention can be preferably used as an electrically insulating barrier film formed together with a damascene wire, an etching stopper film formed when a through-hole is formed throughout an interlayer insulating film by etching, or a hard mask film mechanically protecting an interlayer insulating film, for instance.

Third Exemplary Embodiment

The third exemplary embodiment relates to a semiconductor device in accordance with the present invention.

As mentioned above, the semiconductor device in accordance with the present invention includes at least one circuit element formed on a semiconductor substrate or a semiconductor layer; and a multi-layered wire structure formed on the semiconductor substrate or the semiconductor layer in such a condition as being electrically connected to the at least one circuit element, wherein at least one electrically insulating film among electrically insulating films included in the multi-layered wire structure is comprised of an organic silicon film having a three-dimensional network structure, and containing at least silicon, hydrogen and carbon as a constituent thereof, and an atomic number ratio of carbon atoms to silicon atoms in the organic silicon film is greater than 3.

As an example of an electrically insulating film comprised of the above-mentioned organic silicon film, there are an interlayer insulating film, an electrically insulating barrier film formed together with a damascene wire, an etching stopper film used for formation of a damascene wire, and a hard mask film mechanically protecting an interlayer insulating film, for instance.

In the semiconductor device in accordance with the present invention, at least one of those electrically insulating films is comprised of the above-mentioned organic silicon film. The organic silicon film can be formed (deposited) by the above-mentioned first or second film-fabrication method in accordance with the present invention.

FIG. 4 is a cross-sectional view of a semiconductor device in accordance with the first exemplary embodiment of the present invention.

The semiconductor device 220 illustrated in FIG. 4 is comprised of a semiconductor substrate 201 on which a plurality of circuit elements (not illustrated) are fabricated, and a multi-layered wire structure MWa formed on the semiconductor substrate 201.

The multi-layered wire structure MWa is comprised of a first interlayer insulating film (passivation film) 203 formed on the semiconductor substrate 201, and covering the circuit elements therewith, a first etching stopper film 205 formed on the first interlayer insulating film 203, a first damascene wire 207 formed on the first etching stopper film 205, a second interlayer insulating film 209 formed on the first damascene wire 207, a second etching stopper film 211 formed on the second interlayer insulating film 209, a second damascene wire 213 formed on the second etching stopper film 211, and a third interlayer insulating film 215 formed on the second damascene wire 213.

The first interlayer insulating film 203 is composed of silicon oxide, for instance. It is preferable that a material of which the first interlayer insulating film 203 is composed is selected taking into consideration a shape of the first damascene wire 207, and workability for formation of a via-hole.

The first etching stopper film 205 is composed of inorganic material such as silicon oxide, silicon nitride, silicon carbide, silicon carbide-nitride, SiOC, and SiOCH, organic material such as polyallyl ether, or organic-inorganic complex comprised of at least one of the above-mentioned inorganic materials, and organic material.

The first interlayer insulating film 203 and the first etching stopper film 205 can be formed by physical vapor deposition (PSD), CVD, or spin-coating in dependence on a material of which the films are composed.

The first damascene wire 207 is comprised of an electrically conductive barrier metal film 207a, an electrically conductive layer 207b formed on the electrically conductive barrier metal film 207a, and an electrically insulating barrier metal film 207c formed on the electrically conductive layer 207b. The electrically conductive barrier metal film 207a covers a sidewall and a bottom of the electrically conductive layer 207b therewith.

The electrically conductive barrier metal film 207a is comprised of a single film or multi-layered films formed by depositing refractive metal such as tantalum (Ta), tantalum nitride (TaN), titanium nitride (TiN), tungsten carbide-nitride (WCN), or compound thereof by sputtering or CVD (including atomic deposition), for instance. In particular, it is preferable that the electrically conductive barrier metal film 207a is comprised of multi-layered films including a tantalum nitride (TaN) film, and a tantalum (Ta) film formed on the tantalum nitride (TaN) film.

The electrically conductive layer 207b can be formed, for instance, by depositing copper (Cu) by sputtering or CVD, or by depositing copper (Cu) by carrying out electrolytic plating in which copper (Cu) thinly deposited by sputtering or CVD is used as an electrode.

The electrically conductive layer 207b may contain, as well as copper (Cu), aluminum (Al), tin (Sn), titanium (Ti), tungsten (W), silver (Ag), zirconium (Zr), indium (In) or magnesium (Mg), for instance.

The first damascene wire 207 may be designed to further include an adhesive layer between the electrically conductive layer 207b composed of copper (Cu) and the electrically insulating barrier film 207c. The adhesive layer is composed of electrically conductive material other than copper, that is, tungsten (W) or cobalt-tungsten-phosphorus (CoWP).

The electrically insulating barrier film 207c is comprised of an organic silicon film having three-dimensional network structure, and containing at least silicon, hydrogen and carbon as a constituent thereof. An atomic number ratio of carbon atoms to silicon atoms in the organic silicon film is greater than 3.

The electrically insulating barrier film 207c may be designed to have a thickness in the range of about 5 to about 50 nanometers. When the electrically insulating barrier film 207c acting as an underlying wire is comprised of the above-mentioned organic silicon film, it is in particular preferable that the electrically insulating barrier film 207c has a thickness in the range of about 10 to about 30 nanometers.

The second interlayer insulating film 209 is comprised of a single film or multi-layered films composed of inorganic material such as silicon oxide, silicon carbide, and silicon carbide-nitride, organic material such as hydrogen silsesquioxane, methyl silsesquioxane and resin, or organic-inorganic complex comprised of the above-mentioned organic materials and inorganic material. The second interlayer insulating film 209 can be formed by physical vapor deposition (PSD), CVD, or spin-coating in dependence on a material of which the film is composed.

The second interlayer insulating film 209 may be comprised of an organic silicon film fabricated in accordance with the first or second film-fabrication method in accordance with the present invention.

If necessary, the second interlayer insulating film 209 may be designed to have a varying composition and/or density in a thickness-wise direction thereof.

The second etching stopper film 211 can be formed similarly to the formation of the first etching stopper film 205.

Similarly to the first damascene wire 207, the second damascene wire 213 is comprised of an electrically conductive barrier metal film 213a, an electrically conductive layer 213b formed on the electrically conductive barrier metal film 213a, and an electrically insulating barrier metal film 213c formed on the electrically conductive layer 213b. The electrically conductive barrier metal film 213a, the electrically conductive layer 213b, and the electrically insulating barrier metal film 213c can be formed similarly to the formation of the electrically conductive barrier metal film 207a, the electrically conductive layer 207b, and the electrically insulating barrier metal film 207c of the first damascene wire 207.

As illustrated in FIG. 4, the second damascene 213 has a via-contact 213v as a part thereof. The via-contact 213v electrically connects the second damascene wire 213 and the first damascene wire 207 to each other. The via-contact hole 213v is formed in a through-hole formed throughout the second etching stopper film 211, the second interlayer insulating film 209, and the electrically insulating barrier film 207c of the first damascene wire 207.

The third interlayer insulating film 215 can be formed similarly to the formation of the second interlayer insulating film 209.

Herein, "damascene wire" indicates a buried wire formed by forming a trench in an interlayer insulating film by a lithography process (for instance, a photolithography process, an electron-ray lithography process or a X-ray lithography process), filling the trench with electrically conductive material by PVD or plating, and removing a portion of the electrically conductive material existing outside of the trench, for instance, by chemical vapor deposition (CVD). A "damascene wire" generally has a flat upper surface For instance, when a damascene wire is composed of copper (Cu), a copper layer is generally covered at a sidewall and a bottom thereof with electrically conductive barrier metal, and further covered at an upper surface thereof with an electrically insulating barrier film.

In the semiconductor device 200 having the above-mentioned structure, each of the electrically insulating barrier film 207c in the first damascene wire 207 and the electrically insulating barrier film 213c in the second damascene wire 213 is comprised of an organic silicon film containing at least silicon, hydrogen and carbon as a constituent thereof, and having a three-dimensional network structure. An atomic number ratio of carbon atoms to silicon atoms in the organic silicon film is greater than 3.

Since the organic silicon film has three-dimensional network structure, it has a high strength and a high resistance to heat. Furthermore, since an atomic number ratio of carbon atoms to silicon atoms in the organic silicon film is greater than 3, for instance, when the second interlayer insulating film 209 is composed of a material having a low dielectric constant, it would be possible to have the electrically insulating barrier film 207c having a high etching selection ratio (an etching rate ratio) with the second interlayer insulating film 209, ensuring that it is possible to readily form the first damascene wire 207 having a desired shape.

The organic silicon film as mentioned above can be formed by the above-mentioned first or second film-fabrication method in accordance with the present invention.

Thus, it is possible to design the semiconductor device 220 to have a small capacity formed between wires, reduce a current leaking from a wire, and have high reliability, even if integration of circuit elements is set high.

It is also possible to design both the first damascene wire 207 and the second damascene wire 213 in the semiconductor device 220 to have a high resistance to electromigration, or a high resistance (resistance to stress-inducing void) to varying of a wire resistance or breakage of a wire both due to wire stress.

Furthermore, it is possible to design the semiconductor device 220 to have a high resistance to time-dependent dielectric breakdown.

FIG. 5 is a cross-sectional view of a semiconductor device in accordance with the second exemplary embodiment of the present invention.

The semiconductor device 370 illustrated in FIG. 5 is comprised of a semiconductor substrate 310 on which a plurality of circuit elements (not illustrated) are fabricated, and a multi-layered wire structure MWb formed on the semiconductor substrate 310.

The multi-layered wire structure MWb is comprised of a first interlayer insulating film (passivation film) 320 covering therewith a plurality of circuit elements fabricated on the semiconductor substrate 310, a first etching stopper film 322 formed on the first interlayer insulating film 320, a first damascene wire part 330 formed on the first etching stopper film 322, a second damascene wire part 335 formed on the first damascene wire part 330, a third damascene wire part 340 formed on the second damascene wire part 335, a fourth damascene wire part 345 formed on the third damascene wire part 340, a fifth damascene wire part 350 formed on the fourth damascene wire part 345, interlayer insulating films 360 formed between the damascene wire parts disposed adjacent to each other, and hard mask films 362 formed on each of the interlayer insulating films 360.

In the semiconductor device 370 illustrated in FIG. 5, one of the circuit elements formed on the semiconductor substrate 310 is fabricated as a complementary MOS (Metal Oxide Semiconductor: hereinafter, referred to as "CMOS") transistor 305.

The CMOS transistor 305 includes two source regions 302s and 304s formed on the semiconductor substrate 310, two drain regions 302d and 304d formed on the semiconductor substrate 310, a gate electrode 302g formed on a gate insulating film 302i which is formed on the semiconductor substrate 310, between the source region 302s and the drain region 302d, and a gate electrode 304g formed on a gate insulating film 304i which is formed on the semiconductor substrate 310, between the source region 304s and the drain region 304d.

A device-separation film 307 is formed outside the source region 302s, between the drain region 302d and the source region 304s, and outside the drain region 304d. For instance, the device-separation film 307 is composed of silicon oxide.

The first interlayer insulating film 320 may be formed similarly to the formation of the first interlayer insulating film 203 in the semiconductor device 220 illustrated in FIG. 4. A predetermined number of contact plugs 315 is formed throughout the first interlayer insulating film 320 for electrically connecting circuit elements formed on the semiconductor substrate 310, and the first damascene circuit 330 to each other.

The first electrically insulating barrier film 322 formed on the first interlayer insulating film 320 may be formed similarly to the formation of the electrically insulating barrier films 207c and 213c in the semiconductor device 220 illustrated in FIG. 4.

Each of the damascene wire parts 330, 335, 340 and 350 is comprised of a predetermined number of damascene wires. Each of the damascene wires is comprised of an electrically conductive barrier metal film 330a, 335a, 340a, 345a or 350a, an electrically conductive layer 330b, 335b, 340b, 345b or 350b formed on the electrically conductive barrier metal film 330a, 335a, 340a, 345a or 350a, respectively, and an electrically insulating barrier film 330c, 335c, 340c, 345c or 350c formed on the electrically conductive layer 330b, 335b, 340b, 345b or 350b, respectively. Each of electrically conductive layers 330b, 335b, 340b, 345b and 350b is covered at a sidewall and a bottom thereof with the electrically conductive barrier metal films 330a, 335a, 340a, 345a and 350a, respectively. Each of electrically conductive layers 330b, 335b, 340b, 345b and 350b is covered at an upper surface thereof with the electrically insulating barrier films 330c, 335c, 340c, 345c and 350c, respectively.

The electrically conductive barrier metal films 330a, 335a, 340a, 345a and 350a, the electrically conductive layers 330b, 335b, 340b, 345b and 350b, and the electrically insulating barrier films 330c, 335c, 340c, 345c and 350c may be formed similarly to the formation of the electrically conductive barrier metal films 207a and 213a, the electrically conductive layers 207b and 213b, and the electrically insulating barrier films 207c and 213c, respectively.

Each of the interlayer insulating films 360 may be formed, for instance, similarly to the formation of the first interlayer insulating film 203, the second interlayer insulating film 209 or the third interlayer insulating film 215 in the semiconductor device 220 illustrated in FIG. 4.

The hard mask film 362 is formed on each of the interlayer insulating films 360. Accordingly, even if the interlayer insulating films 360 are comprised of a film composed of organic material and having a relatively small mechanical strength, for instance, it would be possible to readily form a damascene wire part having a desired shape, on the interlayer insulating films 360.

For instance, each of the hard mask films 362 may be comprised of an organic silicon film, a silicon oxide film or a SiOCH film formed in accordance with the above-mentioned first or second film-fabrication method in accordance with the present invention.

In the semiconductor device 370 having the above-mentioned structure, the first electrically insulating barrier film 322, and the electrically insulating barrier films 330c, 335c, 340c, 345c and 350c in any one of the damascene wire parts 330, 335, 340, 345 and 350 may be comprised of an organic silicon film fabricated in accordance with the above-mentioned first or second film-fabrication method in accordance with the present invention.

Each of the hard mask films 362 may be comprised of an organic silicon film fabricated in accordance with the first or second film-fabrication method in accordance with the present invention.

At least one of the first electrically insulating barrier film 322, the electrically insulating barrier films 330c, 335c, 340c, 345c and 350c, and the hard mask films 362 may be comprised of an organic silicon film fabricated in accordance with the first or second film-fabrication method in accordance with the present invention, that is, an organic silicon film having a three-dimensional network structure, containing at least silicon, hydrogen and carbon as a constituent thereof, and having an atomic number ratio of carbon atoms to silicon atoms being greater than 3. Thus, as explained with respect to the semiconductor device 220 illustrated in FIG. 4, it is possible to design the semiconductor device to have a small capacity formed between wires, reduce a current leaking from a wire, and have high reliability, even if integration of circuit elements is set high.

Furthermore, it is possible to readily enhance a resistance to electromigration or a resistance to stress-inducing void in each of the damascene wires.

Furthermore, it is possible to readily enhance a resistance to time-dependent dielectric breakdown (TDDB) in each of the damascene wires.

The semiconductor device in accordance with the present invention is not to be limited to the semiconductor device having the structure illustrated in FIGS. 4 and 5. The structure of the semiconductor device may be varied.

For instance, any film or layer in the multi-layered wire structure may be comprised of an organic silicon film in accordance with the first or second film-fabrication method in accordance with the present invention.

The semiconductor device in accordance with the present invention may be designed to include a plurality of circuit elements formed on a semiconductor substrate, or a plurality of circuit elements formed on a semiconductor layer like a SOI (Silicon on Insulator) substrate or a substrate of an active matrix drive type liquid crystal display panel. Specifically, the semiconductor device in accordance with the present invention may be comprised of a semiconductor device including a memory circuit such as DRAM (Dynamic Random Access Memory), SRAM (Static Random Access Memory), a flash memory, FRAM (Ferro Electric Random Access Memory), MRAM (Magnetic Random Access Memory) or a resistance-varying type memory, a semiconductor device including a logic circuit such as a microprocessor, a mixture type semiconductor device including a plurality of the above-mentioned semiconductor devices, or SIP (Silicon in Package) including a plurality of the above-mentioned semiconductor devices formed vertically. As an alternative, the semiconductor device in accordance with the present invention may be comprised of a panel substrate used in an active matrix drive type display unit, such as a panel used for the above-mentioned liquid crystal display panel.

The semiconductor device in accordance with the present invention is applicable to an optical circuit device having at least partially a buried type wire structure, a quantum circuit device or a micro-machine.

Fourth Exemplary Embodiment

The fourth exemplary embodiment relates to a method of fabricating the semiconductor device in accordance with the third exemplary embodiment of the present invention.

A method of fabricating a semiconductor device, in accordance with the third exemplary embodiment, provides a method of fabricating the semiconductor device in accordance with the above-mentioned third exemplary embodiment. The method includes a first step of preparing a semiconductor substrate or a semiconductor layer on which at least one circuit element is fabricated, and a second step of forming a multi-layered wire structure on the semiconductor substrate or the semiconductor layer such that the multi-layered wire structure is electrically connected to the at least one circuit element. The second step includes a sub-step of forming an organic silicon film as an interlayer insulating film or as an electrically insulating film other than an interlayer insulating film.

The organic silicon film is formed in the sub-step by carrying out chemical vapor deposition with organic silicon compound being used as a raw material gas, the organic silicon compound containing at least silicon, hydrogen and carbon as a constituent thereof, and containing two or more groups having unsaturated bond, per a molecule thereof, the raw material gas being used in mixture with a silicon hydride gas in the chemical vapor deposition.

A semiconductor substrate or a semiconductor layer to be prepared in the first step may be made by ourselves, or may be purchased. A semiconductor substrate or a semiconductor layer to be prepared is selected in dependence on a purpose and/or a grade of a target semiconductor device, and so on.

When a semiconductor substrate or a semiconductor layer on which at least one circuit element is fabricated is fabricated by ourselves, a method of fabricating the same is not to be limited to a specific method, and hence, we can select any method.

Similarly, a specific structure of the multi-layered wire structure fabricated in the second step is selected in dependence on a purpose and/or a grade of a target semiconductor device, and so on.

The second step includes the sub-step for forming an organic silicon film acting as an interlayer insulating film or as an electrically insulating film other than an interlayer insulating film. In the sub-step, the above-mentioned organic silicon film is formed in accordance with the above-mentioned first or second film-fabrication method in accordance with the present invention.

Decision about which layer or film in the multi-layered wire structure is comprised of the above-mentioned organic silicon film is mentioned earlier in the explanation about the semiconductor device in accordance with the third exemplary embodiment of the present invention.

Since the first and second film-fabrication method in accordance with the present invention has been explained in detail, explanation about them is omitted herein. A method of fabricating a part other than the above-mentioned organic silicon film in the multi-layered wire structure is not to be limited to a specific one, but various methods may be selected for fabricating such a part. A typical method for doing so has been already explained in the explanation about the semiconductor device in accordance with the third exemplary embodiment of the present invention.

Four examples and one reference example of the formation of the organic silicon film are explained hereinbelow.

Example 1

Formation of Organic Silicon Film

FIGS. 6A to 6E are cross-sectional views each showing a respective step of a process of forming an organic silicon film.

First, as illustrated in FIG. 6A, a first electrically insulating barrier film 405, a first interlayer insulating film 410, and a second interlayer insulating film 415 were formed on this order on a copper layer 401.

The first electrically insulating barrier film 405 was formed in accordance with the first film-fabrication method in accordance with the present invention by plasma-enhanced CVD through the use of the organic silicon compound expressed with the above-mentioned formula (Ia), that is, vaporized tetravinyl silane as a raw material gas in mixture with a mono-silane ($SiH_4$) gas. The conditions for forming the film were as follows.
(a) temperature of substrate: 350 degrees centigrade
(b) flow rate of carrier gas (He gas): 500 sccm
(c) flow rate of raw material gas: 30 sccm
(d) flow rate of mono-silane gas: 30 sccm
(e) pressure in chamber: 2.7 Torr (about 360 Pa)
(f) RF power: 100 W The resultant first electrically insulating barrier film 405 had a thickness of 30 nanometers. A volume between electrodes in a reactor (chamber) was 689 $cm^3$.

The resultant first electrically insulating barrier film 405 had a dielectric constant of 3.5. A leaked current at room temperature under an electric field of 1 MV/cm was $5 \times 10^{-10}$ $A/cm^2$.

An atomic number ratio between silicon atoms (Si) and carbon atoms (C) was confirmed as Si:C=1:7.5 by the composition analysis carried out in accordance with RBS (Ratherford Back Scattering) process. This atomic number ratio was almost identical to the atomic number ratio in the raw material gas.

The barrier performance against scattering of copper (Cu) was almost identical to the same of a silicon nitride (SiN) film fabricated in accordance with PE-CVD.

The first interlayer insulating film 410 was formed as a SiOCH film having a thickness of 150 nanometers, formed by plasma-enhanced CVD through the use of "Black Diamond" (tradename) commercially available from AMAT as a raw material.

The second interlayer insulating film 415 was formed as a porous SiOCH film having a thickness of 150 nanometers, formed by plasma-enhanced CVD through the use of "Aurora-ULK" (tradename) commercially available from Japan ASM as a raw material.

Then, a resist pattern having a desired pattern was formed on the second interlayer insulating film 415 by lithography process. Then, as illustrated in FIG. 6B, a through-hole 415a was formed throughout the second interlayer insulating film 415 by dry etching through the use of the resist pattern as an etching mask.

Then, a through-hole 410a was formed throughout the first interlayer insulating film 410, similarly to the formation of the through-hole 415a.

The dry etching was carried out under the following conditions by means of a parallel-plate type dry etching apparatus through the use of a mixture gas of tetrafluoro methane ($CF_4$), argon (Ar) and nitrogen ($N_2$) as an etching gas wherein $CF_4$:Ar:$N_2$=30:1000:30 with respect to a gas flow rate.
(a) source power: 1000 W
(b) source frequency: 60 MHz
(c) bias power: 100 W
(d) bias frequency: 2 MHz
(e) pressure in chamber: 30 mTorr (about 4 Pa)
(f) temperature of substrate: 20 degrees centigrade Since the first electrically insulating film 405 acted as an etching stopper film, the copper layer 401 was not etched.

Then, as illustrated in FIG. 6C, a through-hole 405a was formed throughout the first electrically insulating film 405 in continuity with the through-hole 401a by means of the same dry etching apparatus as the above-mentioned dry etching apparatus. Thus, there was obtained a dual-damascene groove DG consisting of the through-holes 405a, 410a and 415a.

The dry etching was carried out under the following conditions through the use of a mixture gas of tetrafluoro methane ($CF_4$), argon (Ar) and oxygen ($O_2$) as an etching gas wherein $CF_4$:Ar:$O_2$=30:1000:30 with respect to a gas flow rate.
(a) source power: 1000 W
(b) source frequency: 60 MHz
(c) bias power: 100 W
(d) bias frequency: 2 MHz
(e) pressure in chamber: 50 mTorr (about 6.67 Pa)
(f) temperature of substrate: 20 degrees centigrade A two-layered electrically conductive barrier metal film 420 was formed by forming a tantalum nitride film having a thickness of 10 nanometers and a tantalum (Ta) film having a thickness of 5 nanometers on this order by sputtering in the dual-damascene groove DG and on an exposed surface of the copper layer 401.

Then, copper (Cu) was precipitated in the dual-damascene groove DG by electrolytic plating in which the copper (Cu) layer was used as a seed layer, to thereby fill the dual-damascene groove DG with copper (Cu).

After carrying out annealing at 350 degrees centigrade for about 30 minutes, both excessive copper (Cu) existing outside of the dual-damascene groove DG and the electrically conductive barrier metal film 420 were removed by CMP to thereby obtain a copper wire 425 covered at a sidewall and a bottom thereof with the electrically conductive barrier metal film 420, as illustrated in FIG. 6D. The copper wire 425 had an upper surface which is substantially on the level with an upper surface of the second interlayer insulating film 415.

Then, as illustrated in FIG. 6E, there was formed a second electrically insulating barrier film 430 having a thickness of 20 nanometers and covering the second interlayer insulating film 415, the electrically conductive barrier metal film 420, and the copper wire 425 therewith.

The conditions for fabricating the second electrically insulating barrier film 430 were identical with the conditions for fabricating the above-mentioned first electrically insulating barrier film 405.

Though FIG. 6E illustrates only one damascene wire, a plurality of damascene wires was actually formed at a predetermined wire pitch.

A capacity formed between wires in the thus obtained damascene wire was 190 fF/mm at a wire pitch of 200 nanometers. It was confirmed that the capacity was lower by 10 fF/mm than a capacity formed between wires in a conventional SiC film (dielectric constant of 5.0) fabricated by plasma-enhanced CVD.

A dielectric resistance between wires was measured. A dielectric breakdown electric field was 4.3 Mv/cm at 125 degrees centigrade at a wire space of 100 nanometers. Thus, it was confirmed that the damascene wire had sufficiently high reliability to dielectric resistance.

Example 2

Formation of Organic Silicon Film

A plurality of damascene wires were fabricated at a predetermined wire pitch similarly to Example 1 except that the first electrically insulating barrier film 405 was comprised of an organic silicon film fabricated in accordance with the first film-fabrication method in accordance with the present invention through the use of isopropyltrivinyl silane as a raw material gas, that is, the organic silicon compound expressed with the above-mentioned formula (IA) wherein each of the groups $R^1$ to $R^3$ is a vinyl group, and the group $R^4$ is an isopropyl group.

The conditions for forming the organic silicon film were as follows.
(a) temperature of substrate: 350 degrees centigrade
(b) flow rate of carrier gas (He gas): 1000 sccm
(c) flow rate of raw material gas: 100 sccm
(d) flow rate of mono-silane gas: 20 sccm
(e) pressure in chamber: 3.0 Torr (about 400 Pa)
(f) RF power: 100 W The resultant organic silicon film (the first electrically insulating barrier film 405) had a thickness of 30 nanometers.

The resultant organic silicon film (the first electrically insulating barrier film 405) had a dielectric constant of 2.7. A leaked current at room temperature under an electric field of 1 MV/cm was $5\times10^{-10}$ A/cm$^2$.

An atomic number ratio between silicon atoms (Si) and carbon atoms (C) was confirmed as Si:C=1:8 by the composition analysis carried out in accordance with RBS process. This atomic number ratio was almost identical to the atomic number ratio in the raw material gas.

The barrier performance against scattering of copper (Cu) was almost identical to the same of a silicon nitride (SiN) film fabricated in accordance with PE-CVD.

A capacity formed between wires in the thus obtained damascene wire was 187 fF/mm at a wire pitch of 200 nanometers. It was confirmed that the capacity was lower by 12 fF/mm than a capacity formed between wires in a conventional SiC film (dielectric constant of 5.0) fabricated by plasma-enhanced CVD.

Example 3

Formation of Organic Silicon Film

A plurality of damascene wires were fabricated at a predetermined wire pitch similarly to Example 1 except that the first electrically insulating barrier film 405 was comprised of an organic silicon film fabricated in accordance with the second film-fabrication method in accordance with the present invention through the use of the organic silicon compound expressed with the above-mentioned formula (IVa) as a raw material gas, that is, vaporized divinylsiloxanebisbenzocyclobutene (DVS-BCB).

The conditions for forming the organic silicon film were as follows.
(a) temperature of substrate: 350 degrees centigrade
(b) flow rate of carrier gas (He gas): 1000 sccm
(c) flow rate of raw material gas: 7 sccm
(d) flow rate of mono-silane gas: 10 sccm
(e) pressure in chamber: 2.7 Torr (about 360 Pa)
(f) RF power: 100 W The resultant organic silicon film (the first electrically insulating barrier film 405) had a thickness of 30 nanometers.

The resultant organic silicon film (the first electrically insulating barrier film 405) had a dielectric constant of 2.7. A leaked current at room temperature under an electric field of 1 MV/cm was $5\times10^{-10}$ A/cm$^2$.

An atomic number ratio between silicon atoms (Si) and carbon atoms (C) was confirmed as Si:C=1:11 by the composition analysis carried out in accordance with RBS process. This atomic number ratio was almost identical to the atomic number ratio in the raw material gas.

The barrier performance against scattering of copper (Cu) was almost identical to the same of a silicon nitride (SiN) film fabricated in accordance with PE-CVD.

A capacity formed between wires in the thus obtained damascene wire was 188 fF/mm at a wire pitch of 200 nanometers. It was confirmed that the capacity was lower by 11 fF/mm than a capacity formed between wires in a conventional SiC film (dielectric constant of 5.0) fabricated by plasma-enhanced CVD.

A dielectric resistance between wires was measured. A dielectric breakdown electric field was 4.1 MV/cm at 125 degrees centigrade at a wire space of 100 nanometers. Thus, it was confirmed that the damascene wire had sufficiently high reliability to dielectric resistance.

Example 4

Formation of Organic Silicon Film

An organic silicon film was fabricated in accordance with the first film-fabrication method in accordance with the present invention through the use of isopropyltrivinyl silane as a raw material gas, that is, the organic silicon compound expressed with the above-mentioned formula (IA) wherein each of the groups $R^1$ to $R^3$ is a vinyl group, and the group $R^4$ is an isopropyl group, and further through the use of mesitylene ($C_9H_{12}$) as an additional gas.

The conditions for forming the organic silicon film were as follows.
(a) temperature of substrate: 350 degrees centigrade
(b) flow rate of carrier gas (He gas): 1000 sccm
(c) flow rate of raw material gas: 60 sccm
(d) flow rate of mesitylene gas: 60 sccm
(e) flow rate of mono-silane gas: 30 sccm
(f) pressure in chamber: 2.7 Torr (about 360 Pa)
(g) RF power: 100 W The resultant organic silicon film had a thickness of 30 nanometers.

The resultant organic silicon film was a porous film, and had a dielectric constant of 2.5. A leaked current at room temperature under an electric field of 1 MV/cm was $5 \times 10^{-10}$ A/cm$^2$.

An atomic number ratio between silicon atoms (Si) and carbon atoms (C) was confirmed as Si:C=1:8 by the composition analysis carried out in accordance with RBS process. This atomic number ratio was almost identical to the atomic number ratio in the raw material gas.

The organic silicon film in accordance with Example 4 may be used as an interlayer insulating film having a low dielectric constant, for instance.

Reference Example

Formation of Organic Silicon Film

An organic silicon film was fabricated similarly to the formation of the first electrically insulating barrier film 405 in accordance with Example 1 except that trimethylvinyl silane was used as a raw material gas, and a mono-silane gas was not used.

The conditions for forming the organic silicon film were as follows in order to accomplish a film-fabrication speed almost identical to a film-fabrication speed at which the first electrically insulating barrier film 405 in accordance with Example 1 was formed.
(a) temperature of substrate: 350 degrees centigrade
(b) flow rate of carrier gas (He gas): 500 sccm
(c) flow rate of raw material gas: 100 sccm
(d) pressure in chamber: 2.7 Torr (about 360 Pa)
(e) RF power: 200 W The resultant organic silicon film had a thickness of 30 nanometers.

The resultant organic silicon film had a dielectric constant of 4.2. A leaked current at room temperature under an electric field of 1 Mv/cm was $7 \times 10^{-10}$ A/cm$^2$.

An atomic number ratio between silicon atoms (Si) and carbon atoms (C) was confirmed as Si:C=1:2 by the composition analysis carried out in accordance with RBS process. This atomic number ratio was significantly deviated from the atomic number ratio in the raw material gas.

While the present invention has been described in connection with certain exemplary embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

This application is based upon and claims the benefit of priority from Japanese Patent Application No. 2005-043232 filed on Feb. 18, 2005, the entire disclosure of which, including specification, claims, drawings and summary, is incorporated herein by reference in its entirety.

What is claimed is:

1. A method of fabricating an organic silicon film by carrying out chemical vapor deposition with organic silicon compound being used as a raw material gas, said organic silicon compound containing at least silicon, hydrogen and carbon as a constituent thereof, and containing two or more groups having unsaturated bond, per a molecule thereof, said organic silicon compound being used in mixture with a silicon hydride gas, wherein said organic silicon compound is expressed with the formula (IA) or (IB), and at least two of the groups $R^1$ to $R^4$ shown in the formula (IA) is any one of the groups expressed with the formulas (i-12) to (i-21), or at least two of the groups $R^{11}$ to $R^{14}$ shown in the formula (IB) is any one of the groups expressed with the formulas (i-1) to (i-21),

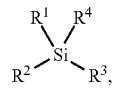

(IA)

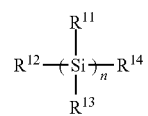

(IB)

("n" indicates an integer equal to or greater than 2)

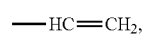

(i-1)

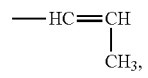

(i-2)

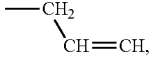

(i-3)

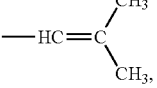

(i-4)

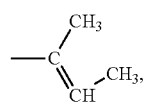

(i-5)

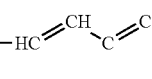

(i-6)

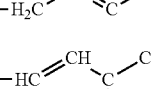

(i-7)

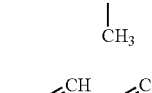

(i-8)

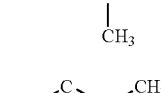

(i-9)

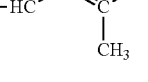

(i-10)

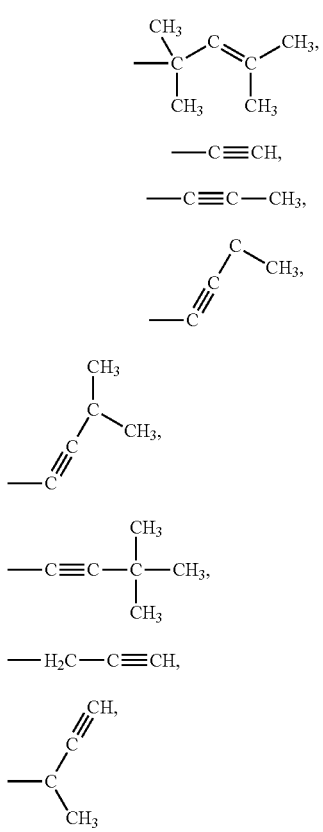

(i-11)
(i-12)
(i-13)
(i-14)
(i-15)
(i-16)
(i-17)
(i-18)

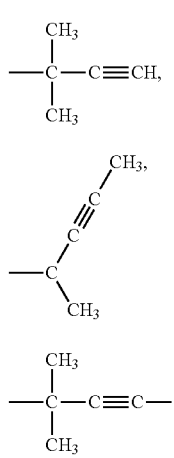

(i-19)
(i-20)
(i-21)

2. The method as set forth in claim 1, wherein said silicon hydride gas is comprised of any one of mono-silane gas, disilane gas, a mixture gas of mono-silane gas and disilane gas.

3. The method as set forth in claim 1, wherein said organic silicon film does not contain oxygen atoms.

4. The method as set forth in claim 1, wherein said chemical vapor deposition is comprised of plasma-enhanced chemical vapor deposition.

* * * * *